(12) United States Patent
Mathada et al.

(10) Patent No.: US 10,922,013 B2
(45) Date of Patent: Feb. 16, 2021

(54) SUSPENDING AND RESUMING A READ OPERATION FOR A NON-VOLATILE MEMORY

(71) Applicant: Western Digital Technologies, Inc., San Jose, CA (US)

(72) Inventors: Revanasiddaiah Prabhuswamy Mathada, Bangalore (IN); Saugata Das Purkayastha, Bangalore (IN); Anantharaj Thalaimalaivanaraj, Bangalore (IN); Nisha Padattil Kuliyampattil, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/948,560

(22) Filed: Apr. 9, 2018

(65) Prior Publication Data
US 2019/0310795 A1 Oct. 10, 2019

(51) Int. Cl.
*G06F 3/06* (2006.01)
*G11C 11/56* (2006.01)
*G11C 16/26* (2006.01)

(52) U.S. Cl.
CPC .......... *G06F 3/0659* (2013.01); *G06F 3/0611* (2013.01); *G06F 3/0652* (2013.01); *G06F 3/0679* (2013.01); *G11C 11/5642* (2013.01); *G11C 16/26* (2013.01)

(58) Field of Classification Search
CPC .. G06F 3/0679; G06F 3/0688; G06F 12/0246; G06F 2212/72–7211
See application file for complete search history.

(56) References Cited

U.S. PATENT DOCUMENTS

| 2002/0188812 A1* | 12/2002 | Sadhasivan | G06F 13/4239 711/153 |
| 2010/0002505 A1* | 1/2010 | Ho | G11C 11/5671 365/185.03 |
| 2015/0095551 A1* | 4/2015 | Confalonieri | G11C 16/06 711/103 |

(Continued)

OTHER PUBLICATIONS

Korean Patent Application 10-2018-0009531. Filed Jan. 25, 2018.*

(Continued)

*Primary Examiner* — Nathan Sadler
(74) *Attorney, Agent, or Firm* — Loza & Loza, LLP; Gabriel Fitch

(57) ABSTRACT

The disclosure relates in some aspects to suspending a read for a non-volatile memory (NVM) device. For example, a lower priority read may be suspended to enable a higher priority read to occur. Once the higher priority read completes, the lower priority read is resumed. To improve the efficiency of the read suspension, the lower priority read may be suspended once data sensing at a current level of the NVM device completes. The data for each level that has already been sensed is then stored so that this data does not need to be sensed again. Once the lower priority read is resumed, the data sensing starts at the next level of the NVM device. The data output for the lower priority read thus includes the stored data for any levels read before the read is suspended, along with the data from the levels read after the read is resumed.

25 Claims, 14 Drawing Sheets

(56) References Cited

U.S. PATENT DOCUMENTS

| | | | |
|---|---|---|---|
| 2015/0186042 A1* | 7/2015 | Lee | G11C 16/32 |
| | | | 711/103 |
| 2016/0179402 A1* | 6/2016 | Iwashiro | G06F 3/0611 |
| | | | 711/103 |
| 2016/0306553 A1* | 10/2016 | Ellis | G06F 3/0611 |
| 2017/0075626 A1* | 3/2017 | Kim | G06F 3/0655 |
| 2018/0032282 A1* | 2/2018 | Hahn | G06F 3/0604 |
| 2018/0247695 A1* | 8/2018 | Kasai | G11C 16/3459 |
| 2018/0335980 A1* | 11/2018 | Chang | G06F 3/0659 |
| 2019/0188125 A1* | 6/2019 | Lin | G06F 12/0246 |
| 2019/0227745 A1* | 7/2019 | Hong | G06F 3/061 |

OTHER PUBLICATIONS

Translation of Korean Patent Application 10-2018-0009531.*
"Flash Data Integrator (FDI) User's Guide"; Intel Corporation; Nov. 1998; http://www.csit-sun.pub.ro/~cpop/Documentatie_SMP/Intel_Microprocessor_Systems/PC_Memory/29783303.pdf; 251 pages.

* cited by examiner

SUSPENDING AND RESUMING A READ OPERATION FOR A NON-VOLATILE MEMORY

FIELD

The disclosure relates, in some embodiments, to non-volatile memory (NVM) devices and memory controllers for use therewith. More specifically, but not exclusively, the disclosure relates to suspending and resuming a read operation for an NVM device.

INTRODUCTION

Solid state data storage devices (hereafter referred to as SSD storage devices) incorporating non-volatile memories (NVMs), such as flash NAND memories, are replacing or supplementing conventional rotating hard disk drives for mass storage in many consumer or industrial electronics and computers. In a typical SSD storage device-based product, a host computing device includes or communicates with an NVM device controller that in turn controls access to one or more NVM devices.

An SSD storage device handles host requests such as host read requests and host write requests to its NVM device, and also performs internal operations such as garbage collection operations, data integrity operations, and wear leveling operations for the NVM device. When handling these host request operations and internal operations, the SSD storage device may prioritize the operations to be performed by the NVM device.

In some aspects, this prioritization may involve an NVM device controller suspending an ongoing operation at an NVM device to submit a higher priority request to the NVM device. As one specific example, a host read operation may have a higher priority than a garbage collection write operation. If a garbage collection write is in progress when a host read has to be serviced, the NVM device controller may put the write operation under suspension to service the host read operation. Further to this end, the NVM device may include program suspend and erase suspend features. If a high priority read arrives at the NVM device when a program operation or an erase operation is ongoing, the NVM device can suspend the program operation or the erase operation.

In the above scenarios, when a low priority read is being serviced at the NVM device and, subsequently, a high priority read arrives, servicing of the high priority read is delayed until the low priority read is no longer active. For example, if a host read (high priority read) arrives after a low priority garbage collection (GC) read (low priority read) has been issued to the NVM device, execution of the host read will be delayed until the garbage collection read is finished. Alternatively, the NVM device may be reset to stop the garbage collection read. In view of the above, it would be advantageous if SSD storage devices could handle operations having different priorities more efficiently.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of the disclosure provides an apparatus for controlling data storage that includes an interface and a processor coupled to the interface. In one example, the processor is configured to: send a first device read command to a non-volatile memory device via the interface to invoke a first read operation; receive a host read command after sending the first device read command; determine that the first read operation is pending after receiving the host read command; send a read suspend command to the non-volatile memory device via the interface as a result of the determination that the first read operation is pending; and send a second device read command to the non-volatile memory device via the interface to invoke a second read operation in response to the host read command, wherein the second device read command is sent after the read suspend command is sent.

One embodiment of the disclosure provides a method of controlling data storage. In one example, the method includes: sending a first device read command to a non-volatile memory device to invoke a first read operation; receiving a host read command after sending the first device read command; determining that the first read operation is pending after receiving the host read command; sending a read suspend command to the non-volatile memory device as a result of the determination that the first read operation is pending; and sending a second device read command to the non-volatile memory device to invoke a second read operation in response to the host read command, wherein the second device read command is sent after the read suspend command is sent.

One embodiment of the disclosure provides an apparatus for controlling data storage. In one example, the apparatus includes: means for sending a first device read command to a non-volatile memory device to invoke a first read operation; means for receiving a host read command after sending the first device read command; mean for determining that the first read operation is pending after receiving the host read command; means for sending a read suspend command to the non-volatile memory device as a result of the determination that the first read operation is pending; and means for sending a second device read command to the non-volatile memory device to invoke a second read operation in response to the host read command, wherein the second device read command is sent after the read suspend command is sent.

One embodiment of the disclosure provides a non-transitory computer-readable medium storing computer-executable code for controlling data storage. In one example, the computer-readable medium includes code to: send a first device read command to a non-volatile memory device to invoke a first read operation; receive a host read command after sending the first device read command; determine that the first read operation is pending after receiving the host read command; send a read suspend command to the non-volatile memory device as a result of the determination that the first read operation is pending; and send a second device read command to the non-volatile memory device to invoke a second read operation in response to the host read command, wherein the second device read command is sent after the read suspend command is sent.

One embodiment of the disclosure provides a data storage apparatus that includes a non-volatile memory array and a processor coupled to the non-volatile memory array. In one example, the processor is configured to: receive a first read command; perform a first read operation on the non-volatile memory array as a result of receiving the first read command; receive another command after receiving the first read command; suspend the first read operation as a result of receiving the other command; perform a second read operation on the non-volatile memory array as a result of receiving the other command; and resume the first read operation after completing the second read operation.

One embodiment of the disclosure provides a method of data storage. In one example, the method includes: receiving a first read command; performing a first read operation on the non-volatile memory array as a result of receiving the first read command; receiving another command after receiving the first read command; suspending the first read operation as a result of receiving the other command; performing a second read operation on the non-volatile memory array as a result of receiving the other command; and resuming the first read operation after completing the second read operation.

One embodiment of the disclosure provides a data storage apparatus. In one example, the apparatus includes: means for receiving a first read command; means for performing a first read operation on the non-volatile memory array as a result of receiving the first read command; means for receiving another command after receiving the first read command; means for suspending the first read operation as a result of receiving the other command; means for performing a second read operation on the non-volatile memory array as a result of receiving the other command; and means for resuming the first read operation after completing the second read operation.

One embodiment of the disclosure provides a non-transitory computer-readable medium storing computer-executable code for storing data. In one example, the computer-readable medium includes code to: receive a first read command; perform a first read operation on a non-volatile memory array as a result of receiving the first read command; receive another command after receiving the first read command; suspend the first read operation as a result of receiving the other command; perform a second read operation on the non-volatile memory array as a result of receiving the other command; and resume the first read operation after completing the second read operation.

These and other aspects of the disclosure will become more fully understood upon a review of the detailed description, which follows. Other aspects, features, and implementations of the disclosure will become apparent to those of ordinary skill in the art, upon reviewing the following description of specific implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while certain implementations may be discussed below as device, system, or method implementations it should be understood that such implementations can be implemented in various devices, systems, and methods.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
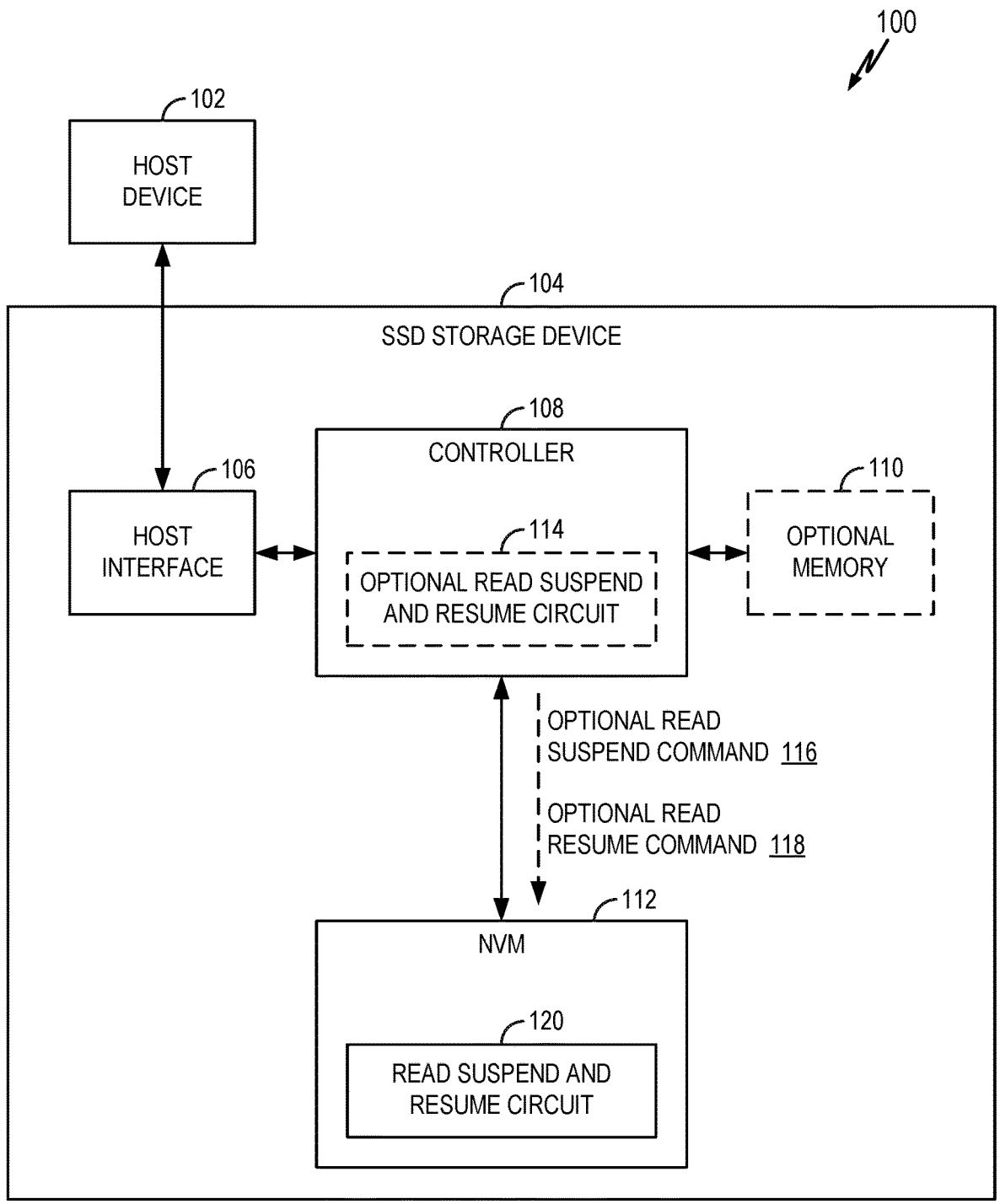
FIG. 1 illustrates an example memory system including a solid state device (e.g., an SSD storage device) configured in accordance with one or more aspects of the disclosure.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

The disclosure relates in some aspects to various apparatuses, systems, methods, and media for suspending a read operation for an NVM device. For example, a lower priority read operation may be suspended to enable a higher priority read to be serviced. Once the higher priority read operation completes, the lower priority read operation is resumed. To improve the efficiency of the read suspension, the lower priority read may be suspended once data sensing at a current level of the NVM device completes. The data for each level that has already been sensed is then stored so that this data does not need to be sensed again. Once the lower priority read is resumed, the data sensing starts at the next level of the NVM device. The data output for the lower priority read operation thus includes the stored data for the read levels completed before the read operation is suspended, along with the data from the levels read after the read operation is resumed.

As used herein, a low (or lower) priority read refers to a read that has a relatively lower priority as compared to a high (or higher) priority read. For example, a low (or lower) priority read may have a first priority and a high (or higher) priority read may have a second priority, where the second priority is higher than the first priority. Other embodiments may use a different number of priorities (e.g., three or more) and/or different types of priorities.

For purposes of illustration, various aspects of the disclosure will be described in the context of a memory system that includes NAND memory technology. A NAND device may be referred to herein as a NAND Flash memory, a NAND memory device, a NAND flash, or a NAND. Generally speaking, a NAND device is a non-volatile memory having high storage density, fast access time, low power requirements in operation and advantageous shock resistance, compared to more conventional memory platforms. Raw NAND devices may be equipped (e.g., configured) with a serial interface such as Open NAND Flash Interface (ONFi), Common Flash Memory Interface (CFI), and the like. NAND devices may be configured as discrete memory chips or packaged with a controller to form a secure digital (SD) memory card, Multi Media Card (MMC), or a solid state disk. A NAND device may be configured with a single flash die, or a plurality of dies. In addition to memory cells, a NAND device may include other components, such as control/address logic components, I/O components, and data register components. It should be appreciated that the teachings herein are also applicable to other forms of memory (e.g., NVM other than NAND devices).

As mentioned above, if a conventional SSD storage device is currently servicing a low priority read, servicing of a high priority read may be delayed until the low priority read is no longer active. The low priority read may become inactive either upon completion of the read sense operation or upon a reset of the NVM device. Each of these scenarios will be described in turn.

For the first scenario, a read of an NVM device involves a read sense operation to read data from an NVM array to a register (e.g., a latch circuit) of the NVM device, along with a data out operation to output the data (e.g., to a controller). Depending on the memory technology and the page being accessed, the data sense operation may take, for example, at least 50 microseconds to read a page and the data out operation may take, for example, at least 100 microseconds to output a page. Some conventional suspend operations wait for the low priority read sense operation to complete, and then abort the low priority data out operation. For example, after a controller issues a device read command for a low priority read of a particular page in memory, the NVM device commences a read sense operation to read that page of the NVM array. If the controller issues a device read command for a high priority read of another page (e.g., in response to a host read command received by the controller) before the low priority read has completed, the NVM device will finish the read sense operation for the low priority read. However, the NVM device will not output the data for the low priority read. Instead, the NVM device will perform a read sense operation for the high priority read and perform the data out operation for the high priority read. The controller will then re-issue the device read command for the low priority read. Thus, in this scenario, the high priority read experiences a delay waiting for the low priority read sense operation to complete (e.g., a delay on the order of 50 to 300 microseconds depending on the memory technology and the page being accessed). Moreover, this delay time is wasted since any data read during the delay (i.e., during low priority read sense operation) is not used.

For the second scenario (NVM reset), if the controller needs to issue a device read command for a high priority read of one page (e.g., in response to a host read command received by the controller) before a low priority read of another page has completed, the controller first issues a reset command to the NVM device. Once the NVM device completes its reset operation, the controller issues the high priority device read command In this case, the delay incurred by the high priority read may be shorter than in the first scenario. However, the controller will still need to re-issue the device read command for the low priority read after the high priority read completes. Thus, this delay time is wasted in this scenario as well since any data read during the low priority read sense operation prior to reset is lost.

In view of the above inefficiencies, the disclosure relates in some aspects to read suspend and read resume operations where an NVM device may quickly suspend a data sense operation and store any data read up to that point, and then continue where it left off once the data sense operation is resumed. Thus, the read suspend and read resume operations may mitigate (e.g., reduce or eliminate) delay that would otherwise be experienced by a high priority read of an NVM device when the NVM device is servicing a low priority read. These aspects and other aspects of the disclosure will now be described in more detail in conjunction with FIGS. 1-5.

Example Memory System

FIG. 1 illustrates an embodiment of a memory system 100 that includes a host device 102 and an SSD storage device 104 coupled to the host device 102. The host device (e.g., a host computer) 102 provides commands to the SSD storage device 104 for transferring data between the host device 102 and the SSD storage device 104. For example, the host device 102 may provide a write command to the SSD storage device 104 for writing data to the SSD storage device 104 or read command to the SSD storage device 104 for reading data from the SSD storage device 104. The host device 102 may be any system or device having a need for data storage or retrieval and a compatible interface for communicating with the SSD storage device 104. For example, the host device 102 may a computing device, a personal computer, a portable computer, or workstation, a server, a personal digital assistant, a digital camera, a digital phone, or the like.

The SSD storage device 104 includes a host interface 106, a controller 108, an optional memory 110, and an NVM 112. The host interface 106 is coupled to the controller 108 and facilitates communication between the host device 102 and the controller 108. Additionally, the controller 108 is coupled to the memory 110 and the non-volatile memory 112. The host interface 106 may be any type of communication interface, such as an Integrated Drive Electronics (IDE) interface, a Universal Serial Bus (USB) interface, a Serial Peripheral (SP) interface, an Advanced Technology Attachment (ATA) interface, a Small Computer System Interface (SCSI), an IEEE 1394 (Firewire) interface, or the like. In some embodiments, the host device 102 includes the SSD storage device 104 (e.g., the host device 102 and the SSD storage device 104 are implemented as a single component). In other embodiments, the SSD storage device 104 is remote with respect to the host device 102 or is contained in a remote computing system coupled in communication with the host device 102. For example, the host device 102 may communicate with the SSD storage device 104 through a wireless communication link.

The controller 108 controls operation of the SSD storage device 104. In various embodiments, the controller 108 receives commands from the host device 102 through the host interface 106 and performs the commands to transfer data between the host device 102 and the non-volatile memory 112. In addition, the controller 108 performs internal operations such as garbage collection operations, data integrity operations, and wear leveling operations. The controller 108 may include any type of processing device, such as a microprocessor, a microcontroller, an embedded controller, a logic circuit, software, firmware, or the like, for controlling operation of the SSD storage device 104.

In some embodiments, some or all of the functions described herein as being performed by the controller 108 may instead be performed by another element of the SSD storage device 104. For example, the SSD storage device 104 may include a microprocessor, a microcontroller, an embedded controller, a logic circuit, software, firmware, or any kind of processing device, for performing one or more of the functions described herein as being performed by the controller 108. In some embodiments, one or more of the functions described herein as being performed by the controller 108 are instead performed by the host device 102. In some embodiments, some or all of the functions described herein as being performed by the controller 108 may instead be performed by another element such as a controller in a hybrid drive including both non-volatile memory elements and magnetic storage elements.

The memory 110 may be any memory, computing device, or system capable of storing data. For example, the memory 110 may be a random-access memory (RAM), a dynamic random-access memory (DRAM), a static random-access memory (SRAM), a synchronous dynamic random-access memory (SDRAM), a flash storage, an erasable programmable read-only-memory (EPROM), an electrically erasable programmable read-only-memory (EEPROM), or the like. In various embodiments, the controller 108 uses the memory 110, or a portion thereof, to store data during the transfer of data between the host device 102 and the non-volatile memory 112. For example, the memory 110 or a portion of the memory 110 may be a cache memory.

In practice, the controller 108 may perform many garbage collection read and write operations for every host read operation. Thus, there is a high probability that a garbage collection operation may be active when a host read is issued.

To address this issue and other similar issues, the controller 108 and/or the NVM 112 are configured to perform read suspend and read resume operations as described herein. For example, as shown in FIG. 1, the controller 108 optionally includes a read suspend and resume circuit 114 for issuing a read suspend command 116 and a read resume command 118 to the NVM 112, while the NVM 112 includes a read suspend and resume circuit 120 for conducting a read suspend operation and a read resume operation either automatically or in response to the read suspend command 116 and the read resume command 118, respectively.

For an embodiment that uses the read suspend command 116, in response to a high priority read (not shown) issued by the host device 102, the read suspend and resume circuit 114 determines whether the NVM 112 is currently servicing a low priority read. If not, the read suspend and resume circuit 114 issues a device read command (not shown) for the high priority read to the NVM 112. If, on the other hand, the NVM 112 is currently servicing a low priority read, the read suspend and resume circuit 114 sends the read suspend command 116 to the NVM.

In response to the read suspend command 116, the read suspend and resume circuit 120 suspends the low priority read operations at the NVM 112 at the current NVM read level (e.g., level (or state) Er to G for triple-level cell (TLC) technology) and stores any data read to this point (e.g., in an internal latch). The read suspend and resume circuit 114 then issues a device read command (not shown) for the high priority read to the NVM 112. After the high priority read is completed, the read suspend and resume circuit 114 issues the read resume command 118 to the NVM 112. In response to the read resume command 118, the read suspend and resume circuit 120 retrieves the data that was stored for the low priority read and resumes the low priority read operations at the next NVM read level.

For an embodiment where the NVM 112 automatically suspends and resumes a low priority read operation, in response to a device read command for a high priority read (not shown) issued by the controller 108, the read suspend and resume circuit 120 determines whether the NVM 112 is currently servicing a low priority read. If the NVM 112 is currently servicing a low priority read, the read suspend and resume circuit 120 automatically suspends the low priority read operations at the NVM 112 at the current NVM read level (e.g., level (or state) Er to G for triple-level cell (TLC) technology) and stores any data read to this point (e.g., in an internal latch). Once the NVM 112 completes the high priority read operations, the read suspend and resume circuit 120 automatically resumes the low priority read operations at the next NVM read level (retrieving the data that was stored for the low priority read).

In view of the above, it should be appreciated that a high priority read of the memory system 100 may experience less delay compared to the conventional scenarios discussed above since the read sense operation is suspended prior to the entire page being read (e.g., the suspension can occur at NVM read level granularity). Moreover, the low priority read operation is not restarted from the beginning (in contrast with the conventional scenarios discussed above). Thus, the overall efficiency of the memory system 100 may be higher (e.g., read latency may be lower) as compared to these conventional memory systems.

High-Level Read Suspend and Resume Operations

Figure 2:
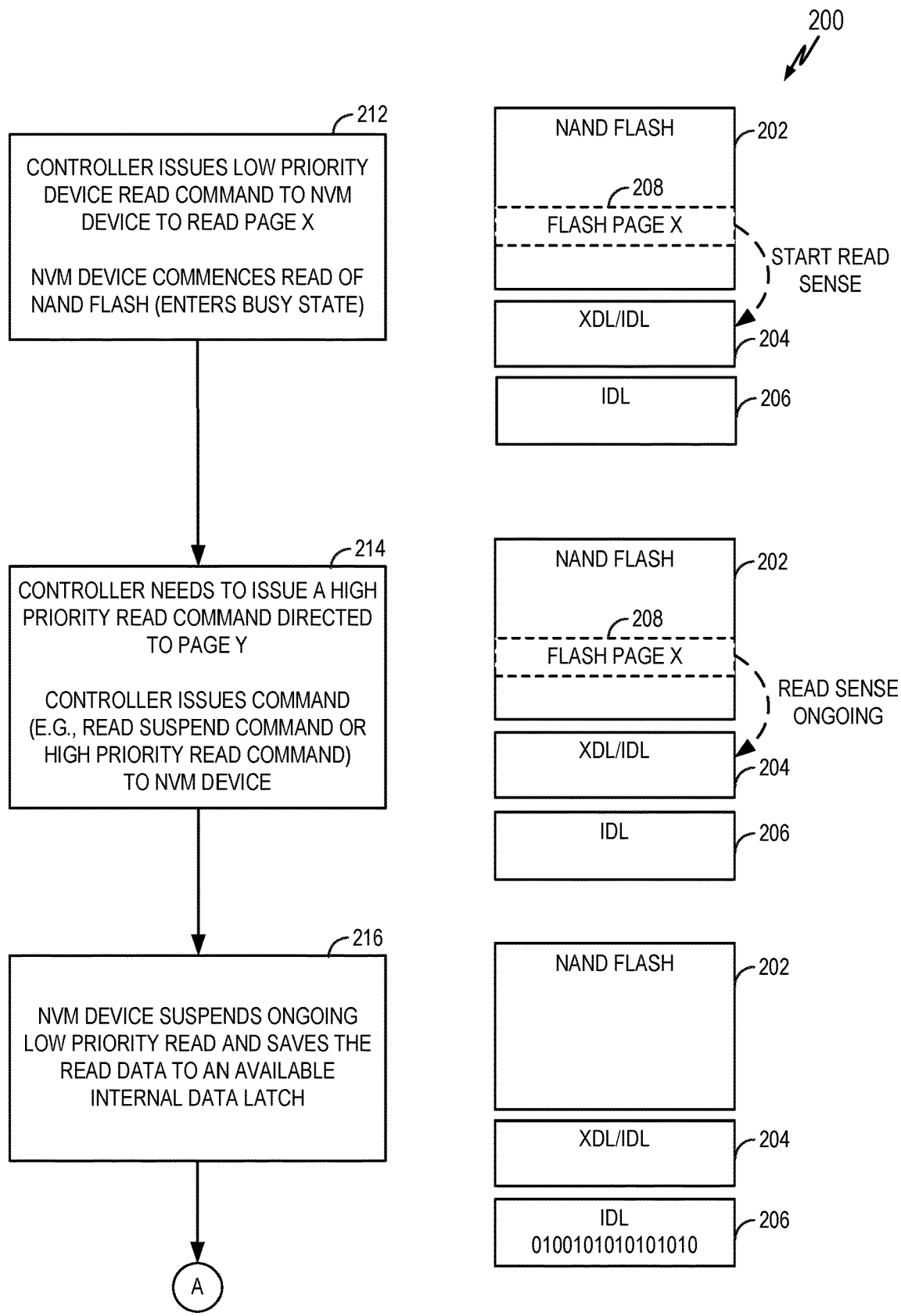
FIG. 2 and FIG. 3 collectively illustrate an example of operations for suspending a read and resuming the suspended read in accordance with one or more aspects of the disclosure.
Figure 3:
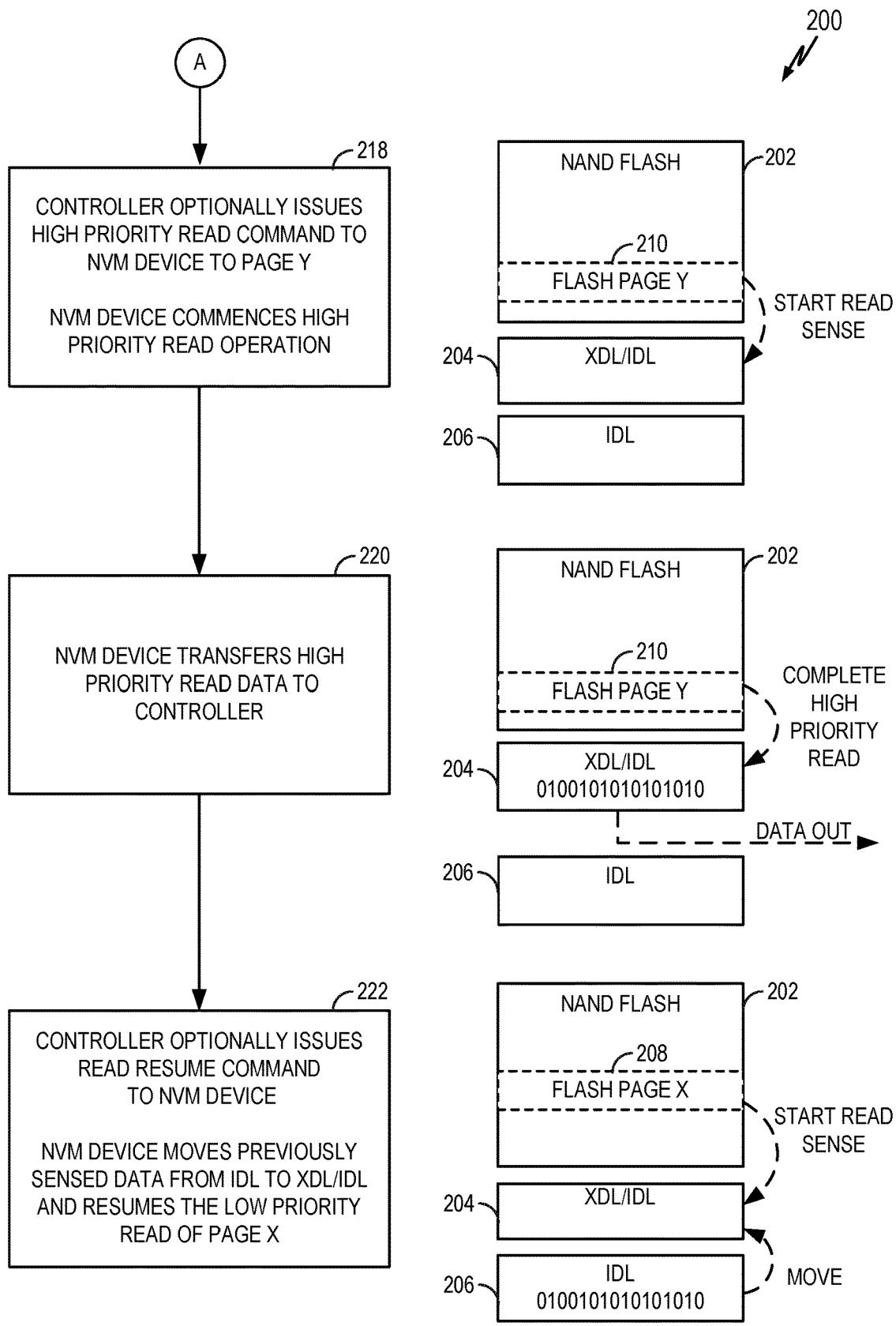

FIGS. 2 and 3 illustrate, at a relatively high level of detail, an embodiment of operations 200 that may be performed in conjunction with suspending and resuming a read operation. The operations 200 may take place within an SSD storage device, an SSD drive, or some other suitable apparatus or apparatuses. For example, some of these operations (e.g., controller operations) may be performed by the read suspend and resume circuit 114 of FIG. 1, while other operations (e.g., NVM device operations) may be performed by the read suspend and resume circuit 120 of FIG. 1.

The operations 200 are described in the context of read sense operations where an NVM device reads data from a NAND flash 202 and stores the data in an external data latch (XDL/IDL 204) and/or an internal data latch (IDL 206). Specifically, a low priority read is issued to read a flash page X 208 and a high priority read is issued to read a flash page Y 210 as illustrated in FIGS. 2 and 3. The term external data latch refers to a latch that holds data that is to be sent to (or, for writes, has been received from) a device (e.g., a controller) external to an NVM device. The term internal data latch refers to a latch that holds data that is used internally by an NVM device. In general, writes to and/or reads from these latches can be performed more quickly than writes to and/or reads from the pages of the NAND flash. Thus, temporarily storing data in a latch can provide improved read or write performance for some operations.

At block 212 of FIG. 2, a controller or other suitable circuitry issues a low priority device read command to the NVM device to read page X 208 of the NAND flash 202. In response, the NVM device commences a read of the NAND flash 202. As indicated in FIG. 2, the NAND flash 202 thus enters a busy state while it is conducting a read sense operation copying data from the flash page X 208 to the XDL/IDL 204.

At block 214, the controller determines that it needs to issue a high priority read command to the NVM device to read a page Y 210 of the NAND flash 202. However, the controller is aware that the low priority read has not completed (e.g., the read sense operation is still ongoing as indicated in FIG. 2). Consequently, in embodiments that use a manual (e.g., command-based) read suspend scheme, the controller issues a read suspend command to the NVM device. Alternatively, in embodiments that use an automatic read suspend scheme, the controller may simply issue the high priority read command to the NVM to page Y.

At block 216, as a result of receiving the command issued at block 214 while the low priority read is being serviced, the NVM device suspends the ongoing low priority read, saving any data read up to this point to the IDL 206. This frees up the NAND flash to service another read.

At block 218 of FIG. 3, in embodiments that use a manual (e.g., command-based) read suspend scheme, once the NAND flash is free, the controller issues the high priority read command to the NVM device to page Y.

In response to the high priority read command received by the NVM device at block 214 (for automatic suspend) or at block 218 (for manual suspend), the NVM device commences a read of the NAND flash 202. As indicated in FIG. 3, the NAND flash 202 again enters a busy state while it is conducting a read sense operation copying data from the flash page Y 210 to the XDL/IDL 204.

At block 220, the NVM device completes the high priority read. At this point, the data from flash page Y 210 has been copied to the XDL/IDL 204. The NVM device then outputs the data from the XDL/IDL 204 (e.g., to the controller).

At block 222, in embodiments that use a manual (e.g., command-based) read suspend scheme, since the high priority read is now complete, the controller issues a read resume command to the NVM device.

In response to the read resume command (for a manual resume scheme) or upon completion of the high priority read (for an automatic resume scheme), the NVM device moves the low priority read data previously stored in the IDL 206 to the XDL/IDL 204, and resumes the data sense operation on page X 208 for the low priority read.

From the above, it should be appreciated that a high priority read may be handled almost immediately even when a low priority read is pending. Moreover, any data read prior to read suspension is saved, thereby improving the efficiency of the low priority read.

Detailed Read Suspend and Resume Operations

Figure 4:
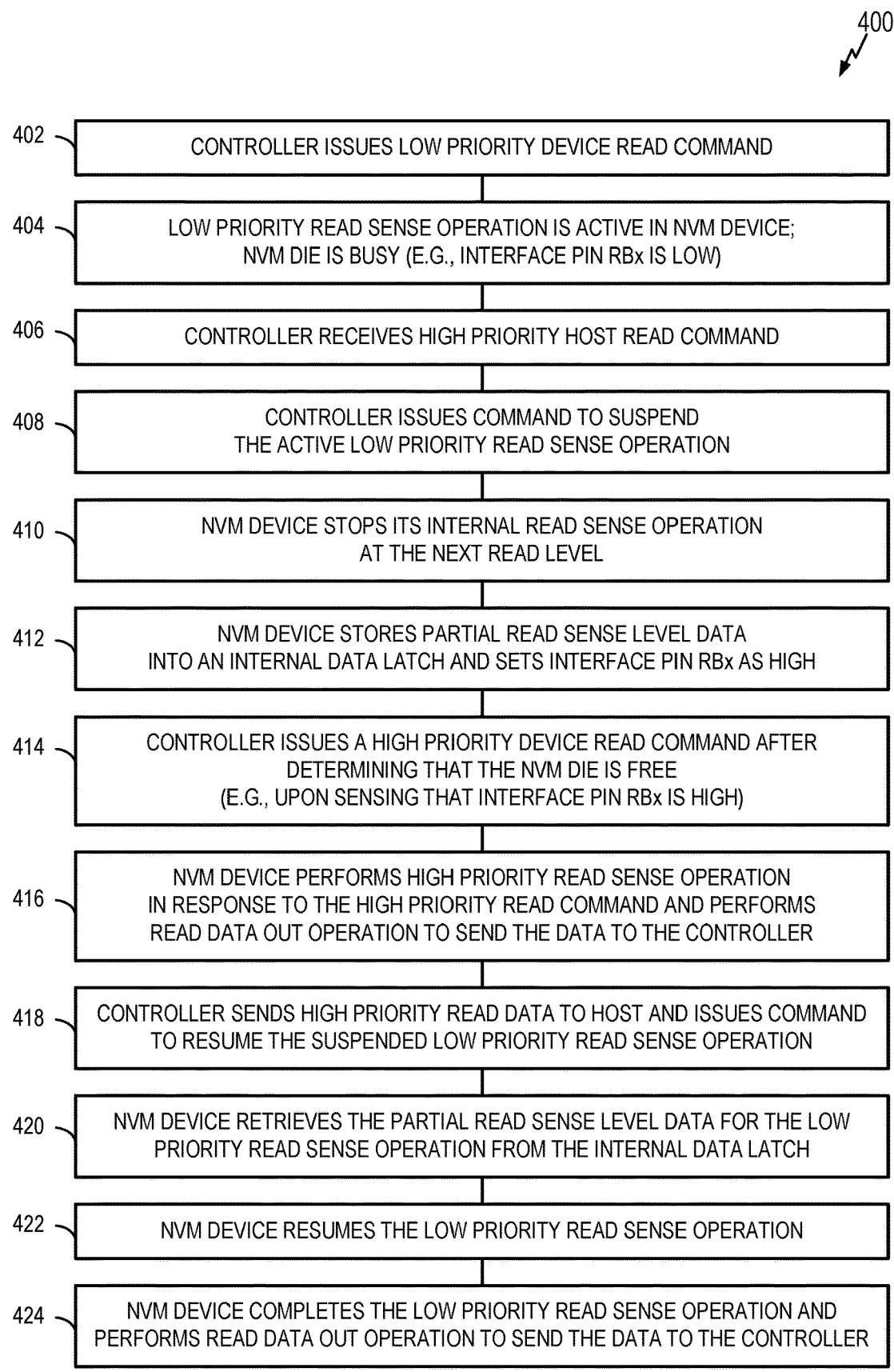
FIG. 4 illustrates another example of operations for suspending a read and resuming the suspended read in accordance with one or more aspects of the disclosure.

With the high-level operations of FIGS. 2 and 3 in mind, FIG. 4 illustrates a more detailed embodiment of operations 400 that may be performed in conjunction with suspending and resuming a read operation for the manual suspend and resume scheme. The operations 400 may take place within an SSD storage device, an SSD drive, or some other suitable apparatus or apparatuses. For example, some of these operations (e.g., controller operations) may be performed by the read suspend and resume circuit 114 of FIG. 1, while other operations (e.g., NVM device operations) may be performed by the read suspend and resume circuit 120 of FIG. 1.

At block 402, a controller (or other suitable apparatus) issues a device read command for a low priority read to an NVM device (or, more generally, a memory device). For example, the controller may need to perform a read operation in conjunction with a garbage collection operation or some other internal operation. As another example, the controller may have received a low priority read request from a host device and issues the device read command in response.

At block 404, in response to the low priority device read command, the NVM device performs a read operation. Thus, a read sense operation will be active for the low priority read at this point in time. In some embodiments, the read operation may involve setting the appropriate word lines and bit lines for the read sense operation.

Since the NVM die (e.g., the NAND die) is busy at this time, the NVM device may set a read/busy signal (e.g., an interface pin RBx) or some other suitable indication to a particular state (e.g., a low state) to indicate as such. In this way, for example, the controller can determine whether a read operation (e.g., a read sense operation) is still active at the NVM device.

At block 406, the controller receives a host read command that has a higher priority than the low priority read.

At block 408, since the low priority read is still active (e.g., as indicated by RBx being low), the controller issues a command to suspend the active low priority read sense operation at the NVM device.

At block 410, the NVM device stops its internal read sense operation at the next read level. For example, if the read sense operation is currently sensing TLC level Er, the NVM device completes the sensing of that level, then stops the read sensing. In some embodiments, such a memory level may be equivalently referred to as a memory state or referenced using other terminology.

In some aspects, the read level may be based on the page type. For example, a lower page level read may perform two levels of sensing, a middle page level read may perform three or four levels of sensing, while a higher page level read may perform sensing of all of the levels.

At block 412, the NVM device stores the data sensed up to this point in time (which may be referred to as the partial read sense level data) into an internal data latch (as opposed to the external data latch). For example, if the NVM device has three internal data latches (e.g., ADL, BDL, and CDL), the NVM device may determine which of these data latches is free and use that data latch to temporarily store the data. In addition, in embodiments that include the interface pin RBx, the memory device may set the interface pin RBx to a high state to indicate that the NVM die is no longer busy.

At block 414, upon determining that the NVM die is free (e.g., the controller senses that the interface pin RBx is high), the controller issues the read command for the high priority read.

At block 416, in response to the read command of block 414, the NVM device performs a read sense operation for the high priority read. Once the read sense operation is complete, the NVM device performs a read data out operation to send the data to the controller. In some embodiments, the NVM device may toggle RBx in conjunction with the read data out operation.

At block 418, the controller sends the data for the high priority read to the host. In addition, upon determining that the NVM die is free (e.g., the controller senses that RBx is high again), the controller issues a read resume command to resume the suspended read sense operation for the low priority read.

At block 420, in response to the read resume command, the NVM device retrieves the partial read sense level data (stored at block 412) from the appropriate internal data latch.

At block 422, the NVM device resumes the suspended read sense operation at the next level (e.g., the level immediately after the last level read at block 410).

At block 424, the NVM device completes the read sense operation for the low priority read, merging the newly sensed data with the previously sensed data (retrieved from the internal latch). Finally, the NVM device performs a read data out operation to send the data to the controller.

Example Data Storage Device

Figure 5:
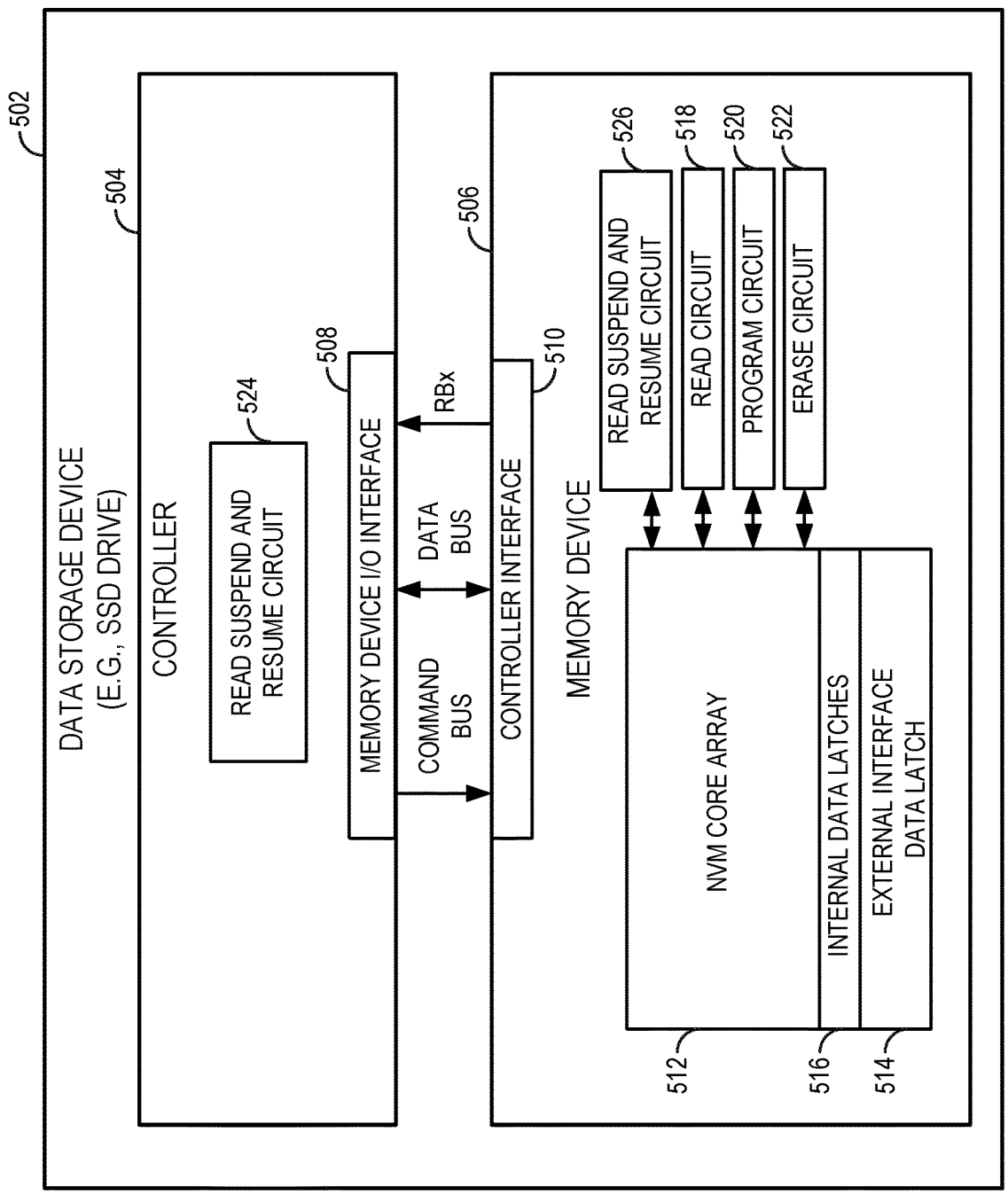
FIG. 5 illustrates an example data storage device (e.g., an SSD storage device) configured in accordance with one or more aspects of the disclosure.

FIG. 5 illustrates an embodiment of a data storage device 502 (e.g., an SSD drive) that may perform multi-tier memory mapping as taught herein. The data storage device includes a controller 504 that writes data to and reads data from a memory device 506 (e.g., an NVM), and performs other associated data storage operations.

The controller 504 and the memory device 506 communicate with one another via corresponding interfaces. The controller 504 includes a memory device input/output (I/O) interface 508 for sending commands to the memory device (e.g., via a command bus), sending data to and receiving data from the memory device 506 (e.g., via a data bus), and for sending and receiving other signaling as applicable (e.g., a read/busy indication (RBx) generated by the memory device 506). Similarly, the memory device 506 includes a controller interface 510 for receiving commands from the controller 504 (e.g., via a command bus), sending data to and receiving data from the controller 504 (e.g., via a data bus), and for sending and receiving other signaling as applicable (e.g., RBx).

The memory device 506 includes an NVM core array 512 for storing data, an external interface data latch 514 for outputting stored data to and receiving data to be stored from the controller interface 510, and a set of internal data latches 516 for storing operational data that is used by the memory device 506. The memory device 506 also includes a read circuit 518 for reading data from the multi-tier NVM core array 512, a program circuit 520 for writing data to the multi-tier NVM core array 512, and an erase circuit 522 for erasing data in the multi-tier NVM core array 512.

In accordance with the teachings herein, the controller 504 includes a read suspend and resume circuit 524 that may be configured to perform any of the operations described herein. For example, the read suspend and resume circuit 524 may correspond to the read suspend and resume circuit 114 of FIG. 1 and perform any of the operations described herein in conjunction with FIGS. 1-4 and 6-11.

Also in accordance with the teachings herein, the memory device 506 includes a read suspend and resume circuit 526 that may be configured to perform any of the operations described herein. For example, the read suspend and resume circuit 526 may correspond to the read suspend and resume circuit 120 of FIG. 1 and perform any of the operations described herein in conjunction with FIGS. 1-4 and 12-14.

Other Aspects

The teachings herein may be used to service a wide variety of read operations. For example, and without limitation, these read operations may include a TLC full sequence read, a TLC single page read, a single-level cell (SLC) read, a cached TLC full sequence read, a cached TLC single page read, a cached SLC read, a TLC program suspend SLC read, or a TLC quick pass write (QPW) program suspend SLC read.

In some embodiments, the number of latches in the NVM may be limited. As a result, a suspend operation might not be supportable for some types of reads due to the lack of sufficient internal latch space to temporarily store the read sense data during suspension. For example, suspension of a low priority read might not be feasible for certain high priority read types (e.g., which need to use most or all of the internal latches). Accordingly, in some embodiments (e.g., a manual suspend scheme), a controller may determine whether suspension is supported for a particular high priority read operation. If suspension is supported, the controller may issue a suspend command if needed. If suspension is not supported, the controller will not issue the suspend command (e.g., the controller may wait for the low priority read to complete, issue a reset to the NVM device, or take some other suitable action). Similarly, in some embodiments (e.g., an automatic suspend scheme), an NVM device may determine whether suspension is supported for a particular high priority read operation and then either invoke the suspension or refrain from invoking the suspension based on this determination.

First Example Apparatus

Figure 6:
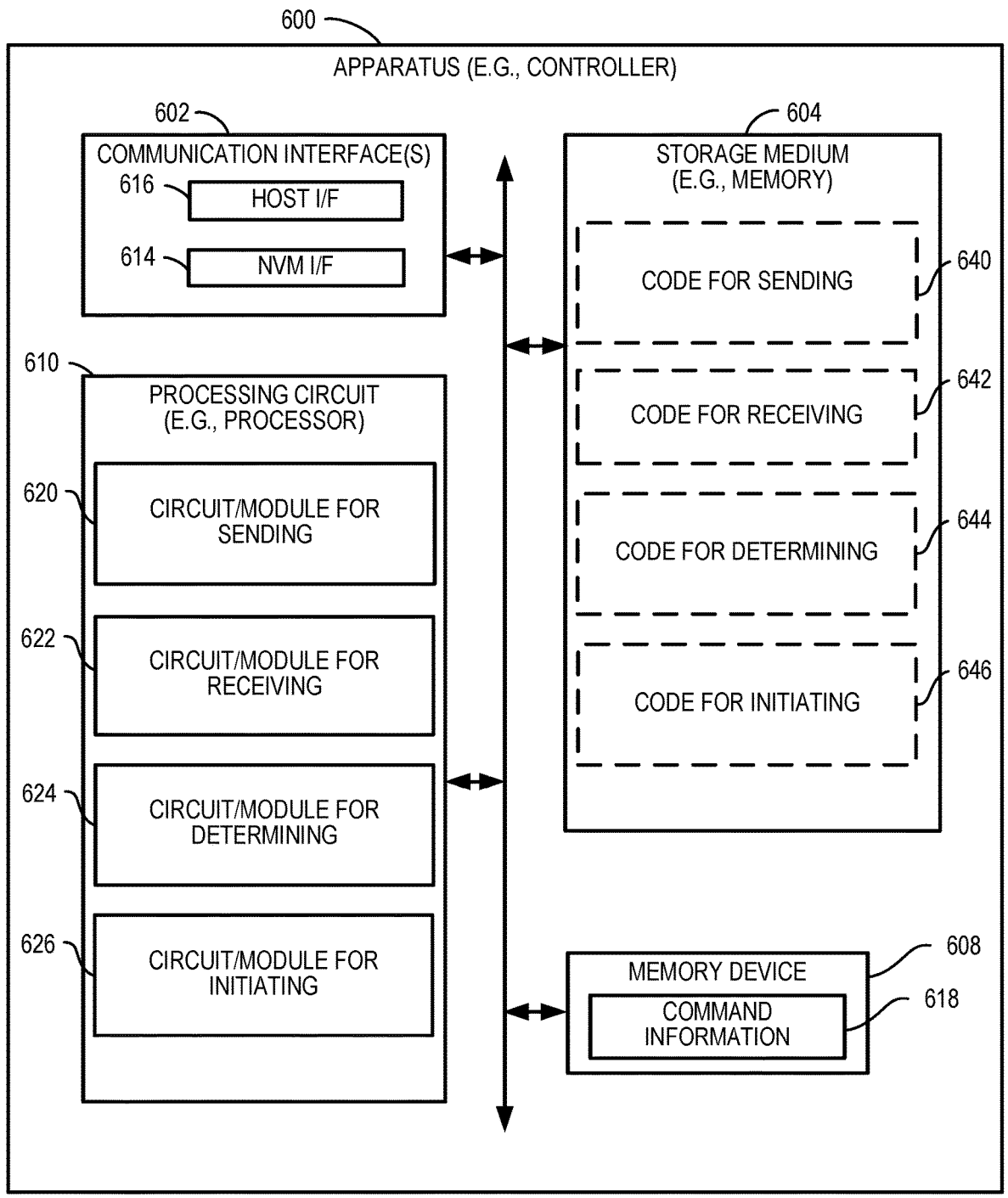
FIG. 6 illustrates an example hardware implementation for an apparatus (e.g., an electronic device) for controlling data storage in accordance with one or more aspects of the disclosure.

FIG. 6 illustrates an embodiment of an apparatus 600 configured to communicate according to one or more aspects of the disclosure. The apparatus 600 could embody or be implemented within a memory controller, an SSD storage device, an SSD drive, a host device, or some other type of device that supports data storage. In various implementations, the apparatus 600 could embody or be implemented within a computing device, a personal computer, a portable device, or workstation, a server, a personal digital assistant, a digital camera, a digital phone, an entertainment device, a medical device, or any other electronic device that stores data.

The apparatus 600 includes a communication interface 602, a storage medium 604, a memory device (e.g., a memory circuit) 608, and a processing circuit 610 (e.g., at least one processor and/or other suitable circuitry). These components can be coupled to and/or placed in electrical communication with one another via a signaling bus or other suitable component, represented generally by the connection lines in FIG. 6. The signaling bus may include any number of interconnecting buses and bridges depending on the specific application of the processing circuit 610 and the overall design constraints. The signaling bus links together various circuits such that each of the communication interface 602, the storage medium 604, and the memory device 608 are coupled to and/or in electrical communication with the processing circuit 610. The signaling bus may also link various other circuits (not shown) such as timing sources, peripherals, voltage regulators, and power management circuits, which are well known in the art, and therefore, will not be described any further.

The communication interface 602 provides a means for communicating with other apparatuses over a transmission medium. In some implementations, the communication interface 602 includes circuitry and/or programming (e.g., a program) adapted to facilitate the communication of information bi-directionally with respect to one or more devices in a system. In some implementations, the communication interface 602 may be configured for wire-based communication. For example, the communication interface 602 could be a bus interface, a send/receive interface, or some other type of signal interface including drivers, buffers, or other circuitry for outputting and/or obtaining signals (e.g., outputting signal from and/or receiving signals into an integrated circuit). The communication interface 602 serves as one example of a means for receiving and/or a means for transmitting. In the example of FIG. 6, the communication interface 602 includes an NVM interface (I/F) 614 and a host I/F 616.

The memory device 608 may represent one or more memory devices. As indicated, the memory device 608 may maintain command information 618 along with other information used by the apparatus 600. In some implementations, the memory device 608 and the storage medium 604 are implemented as a common memory component. The memory device 608 may also be used for storing data that is manipulated by the processing circuit 610 or some other component of the apparatus 600.

The storage medium 604 may represent one or more computer-readable, machine-readable, and/or processor-readable devices for storing programming, such as processor executable code or instructions (e.g., software, firmware), electronic data, databases, or other digital information. The storage medium 604 may also be used for storing data that is manipulated by the processing circuit 610 when executing programming. The storage medium 604 may be any available media that can be accessed by a general purpose or special purpose processor, including portable or fixed storage devices, optical storage devices, and various other mediums capable of storing, containing or carrying programming.

By way of example and not limitation, the storage medium 604 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The storage medium 604 may be embodied in an article of manufacture (e.g., a computer program product). By way of example, a computer program product may include a computer-readable medium in packaging materials. In view of the above, in some implementations, the storage medium 604 may be a non-transitory (e.g., tangible) storage medium. For example, the storage medium 604 may be a non-transitory computer-readable medium storing computer-executable code, including code to perform operations as described herein.

The storage medium 604 may be coupled to the processing circuit 610 such that the processing circuit 610 can read information from, and write information to, the storage medium 604. That is, the storage medium 604 can be coupled to the processing circuit 610 so that the storage medium 604 is at least accessible by the processing circuit 610, including examples where at least one storage medium is integral to the processing circuit 610 and/or examples where at least one storage medium is separate from the processing circuit 610 (e.g., resident in the apparatus 600, external to the apparatus 600, distributed across multiple entities, etc.).

Programming stored by the storage medium 604, when executed by the processing circuit 610, causes the processing circuit 610 to perform one or more of the various functions and/or process operations described herein. For example, the storage medium 604 may include operations configured for regulating operations at one or more hardware blocks of the processing circuit 610, as well as to utilize the communication interface 602 for wireless communication utilizing their respective communication protocols.

The processing circuit 610 is generally adapted for processing, including the execution of such programming stored on the storage medium 604. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 610 is arranged to obtain, process and/or send data, control data access and storage, issue commands, and control other desired operations. The processing circuit 610 may include circuitry configured to implement desired programming provided by appropriate media in at least one example. For example, the processing circuit 610 may be implemented as one or more processors, one or more controllers, and/or other structure configured to execute executable programming Examples of the processing circuit 610 may include a general purpose processor, a digital signal processor (DSP), an application-specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 610 may also be implemented as a combination of computing components, such as a combination of a controller and a microprocessor, a number of microprocessors, one or more microprocessors in conjunction with an ASIC and a microprocessor, or any other number of varying configurations. These examples of the processing circuit 610 are for illustration and other suitable configurations within the scope of the disclosure are also contemplated.

According to one or more aspects of the disclosure, the processing circuit 610 may be adapted to perform any or all of the features, processes, functions, operations and/or routines for any or all of the apparatuses described herein. For example, the processing circuit 610 may be configured to perform any of the steps, functions, and/or processes described with respect to FIGS. 1-5 and 7-11. As used herein, the term "adapted" in relation to the processing circuit 610 may refer to the processing circuit 610 being one or more of configured, employed, implemented, and/or programmed to perform a particular process, function, operation and/or routine according to various features described herein.

The processing circuit 610 may be a specialized processor, such as an application-specific integrated circuit (ASIC) that serves as a means for (e.g., structure for) carrying out any one of the operations described in conjunction with FIGS. 1-5 and 7-11. The processing circuit 610 serves as one example of a means for sending and/or a means for receiving. In various implementations, the processing circuit 610 may provide and/or incorporate, at least in part, the functionality described above for the controller 108 of FIG. 1 or the controller 504 of FIG. 5.

According to at least one example of the apparatus 600, the processing circuit 610 may include one or more of a circuit/module for sending 620, a circuit/module for receiving 622, a circuit/module for determining 624, or a circuit/module for initiating 626. In various implementations, the circuit/module for sending 620, the circuit/module for determining 622, the circuit/module for determining 624, or the circuit/module for initiating 626 may provide and/or incorporate, at least in part, the functionality described above for the controller 108 of FIG. 1 or the controller 504 of FIG. 5.

As mentioned above, a program stored by the storage medium 604, when executed by the processing circuit 610, causes the processing circuit 610 to perform one or more of the various functions and/or process operations described herein. For example, the program may cause the processing circuit 610 to perform the various functions, steps, and/or processes described herein with respect to FIGS. 1-5 and 7-11 in various implementations. As shown in FIG. 6, the storage medium 604 may include one or more of code for sending 640, code for receiving 642, code for determining 644, or code for initiating 646. In various implementations, the code for sending 640, the code for receiving 642, the code for determining 644, or the code for initiating 646 may be executed or otherwise used to provide the functionality described herein for the circuit/module for sending 620, the circuit/module for determining 622, the circuit/module for determining 624, or the circuit/module for initiating 626.

First Example Process

Figure 7:
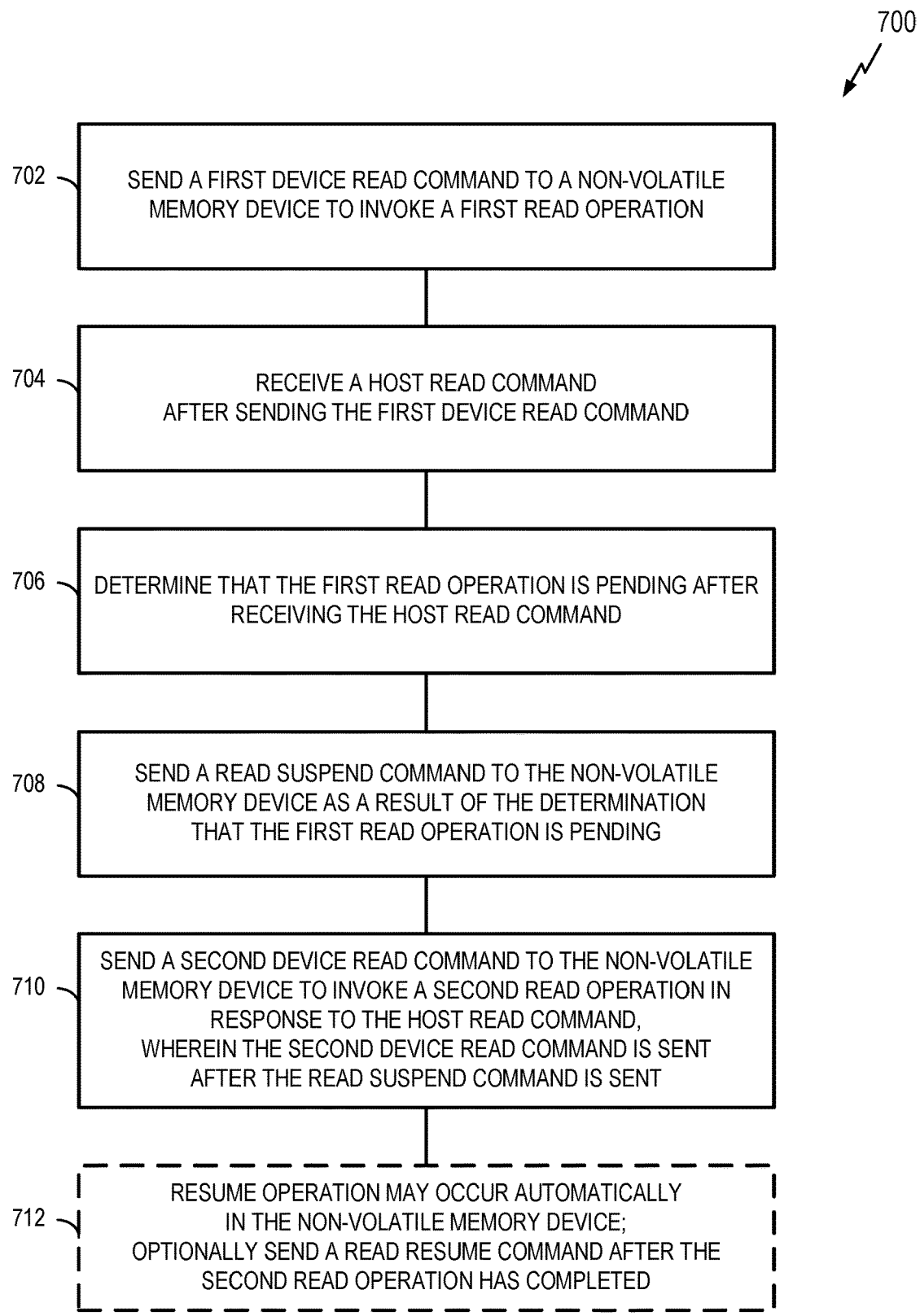
FIG. 7 illustrates an example process for handling prioritized read operations in accordance with one or more aspects of the disclosure.

FIG. 7 illustrates a process 700 for communication in accordance with some aspects of the disclosure. The process 700 may take place within a processing circuit (e.g., the processing circuit 610 of FIG. 6), which may be located in a controller, an SSD storage device, an SSD drive, a host device, or some other suitable apparatus. Of course, in various aspects within the scope of the disclosure, the process 700 may be implemented by any suitable apparatus capable of supporting memory-related operations.

At block 702, an apparatus (e.g., a controller of a solid state drive device) sends a first device read command to a non-volatile memory device via the interface to invoke a first read operation.

At block 704, the apparatus receives a host read command after sending the first device read command at block 702. For example, the apparatus may receive a read request from a host device that request a high priority read from a particular page of the non-volatile memory device.

At block 706, the apparatus determines that the first read operation is pending after receiving the host read command at block 704. In some embodiments, the determination that the first read operation is pending may be based on a signal (e.g., RBx) received from the non-volatile memory device.

At block 708, the apparatus sends a read suspend command to the non-volatile memory device via the interface as a result of the determination at block 706 that the first read operation is pending.

At block 710, the apparatus send a second device read command to the non-volatile memory device via the interface to invoke a second read operation in response to the host read command received at block 704. Here, the second device read command is sent after the read suspend command is sent at block 708.

At optional block 712, the resume operation may occur automatically in the non-volatile memory device. In some embodiments, the apparatus may send a read resume command after the second read operation has completed.

The read operations may take different forms in different embodiments. In some embodiments, the first read operation is associated with a first priority, the second read operation is associated with a second priority, and the second priority is higher than the first priority. In some embodiments, the first read operation may include (e.g., may be) a garbage read operation, and the second read operation may include (e.g., may be) a high priority read operation (e.g., a read operation associated with a higher priority than the first read operation). In some embodiments, examples of a high priority read operation include a full sequence read operation, a single page read operation, a cached read operation, or a program suspend read operation. Other types of high priority read operations may be used in other embodiments.

In some aspects, a process in accordance with the teachings herein may include any combination of the above operations.

Second Example Process

Figure 8:
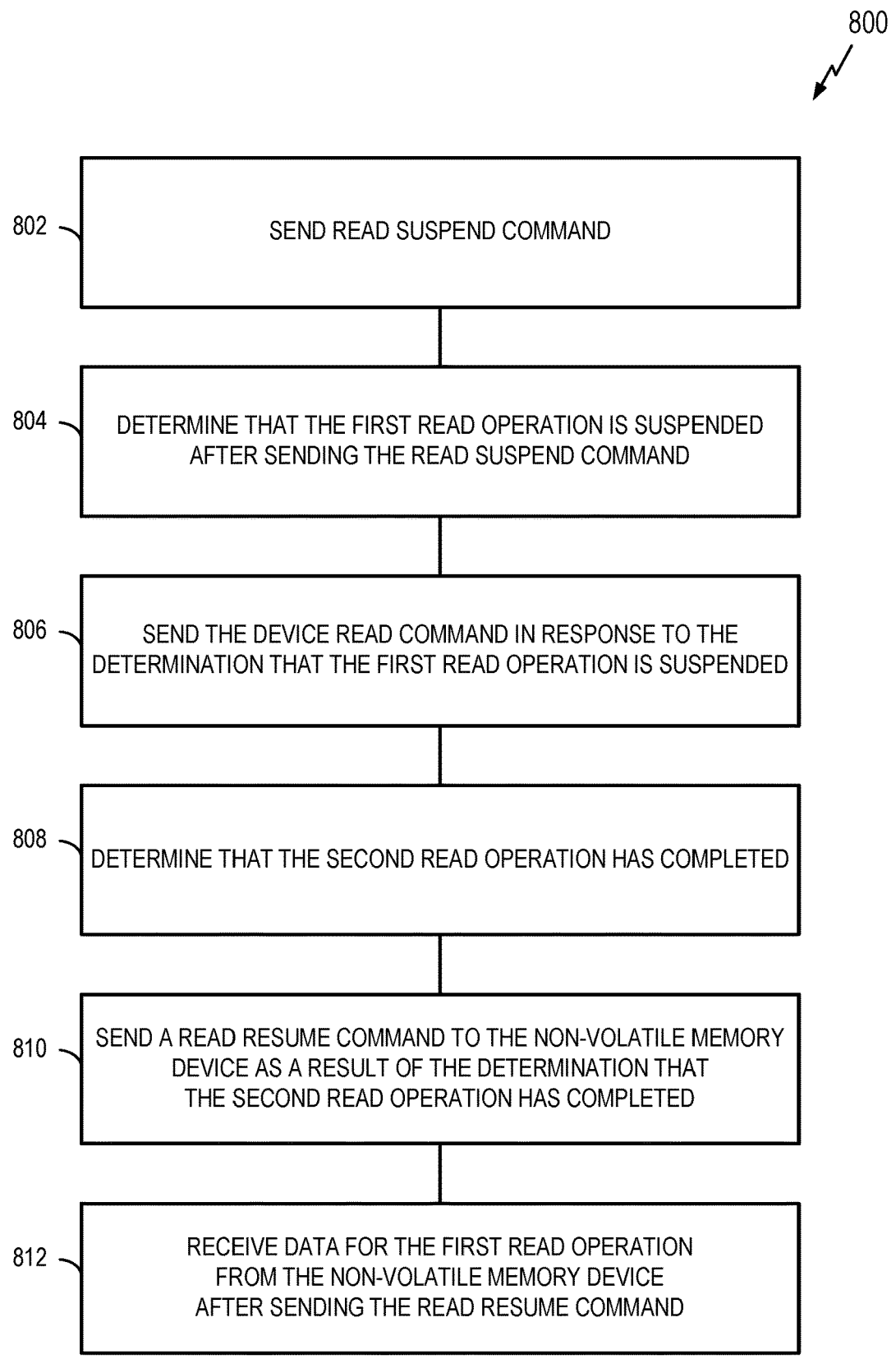
FIG. 8 illustrates an example process for suspending and resuming a read operation in accordance with one or more aspects of the disclosure.

FIG. 8 illustrates a process 800 for communication in accordance with some aspects of the disclosure. One or more aspects of the process 800 may be used in conjunction with (e.g., in addition to or as part of) the process 700 of FIG. 7. The process 800 may take place within a processing circuit (e.g., the processing circuit 610 of FIG. 6), which may be located in a controller, an SSD storage device, an SSD drive, a host device, or some other suitable apparatus. Of course, in various aspects within the scope of the disclosure, the process 800 may be implemented by any suitable apparatus capable of supporting memory-related operations.

At block 802, an apparatus (e.g., a controller) sends a read suspend command. In some implementations, the operations of block 802 may correspond to the operations of block 708 of FIG. 7.

At block 804, the apparatus determines that the first read operation is suspended after sending the read suspend command In some implementations, the determination that the first read operation is suspended may be based on a signal (e.g., RBx) received from the non-volatile memory device.

At block 806, the apparatus sends a device read command in response to the determination that the first read operation is suspended. For example, the sending of the device read command at block 710 of FIG. 7 may be conditionally triggered based on whether the first read operation has been suspended (e.g., the apparatus may wait until RBx is high to send the second device read command).

At block 808, the apparatus determines that the second read operation has completed. In some implementations, the determination that the second read operation has completed may include receiving data for the second read operation from the non-volatile memory device.

At block 810, the apparatus sends a read resume command to the non-volatile memory device as a result of the determination that the second read operation has completed.

At block 812, the apparatus receives data for the first read operation from the non-volatile memory device after sending the read resume command.

In some aspects, a process in accordance with the teachings herein may include any combination of the above operations.

Third Example Process

Figure 9:
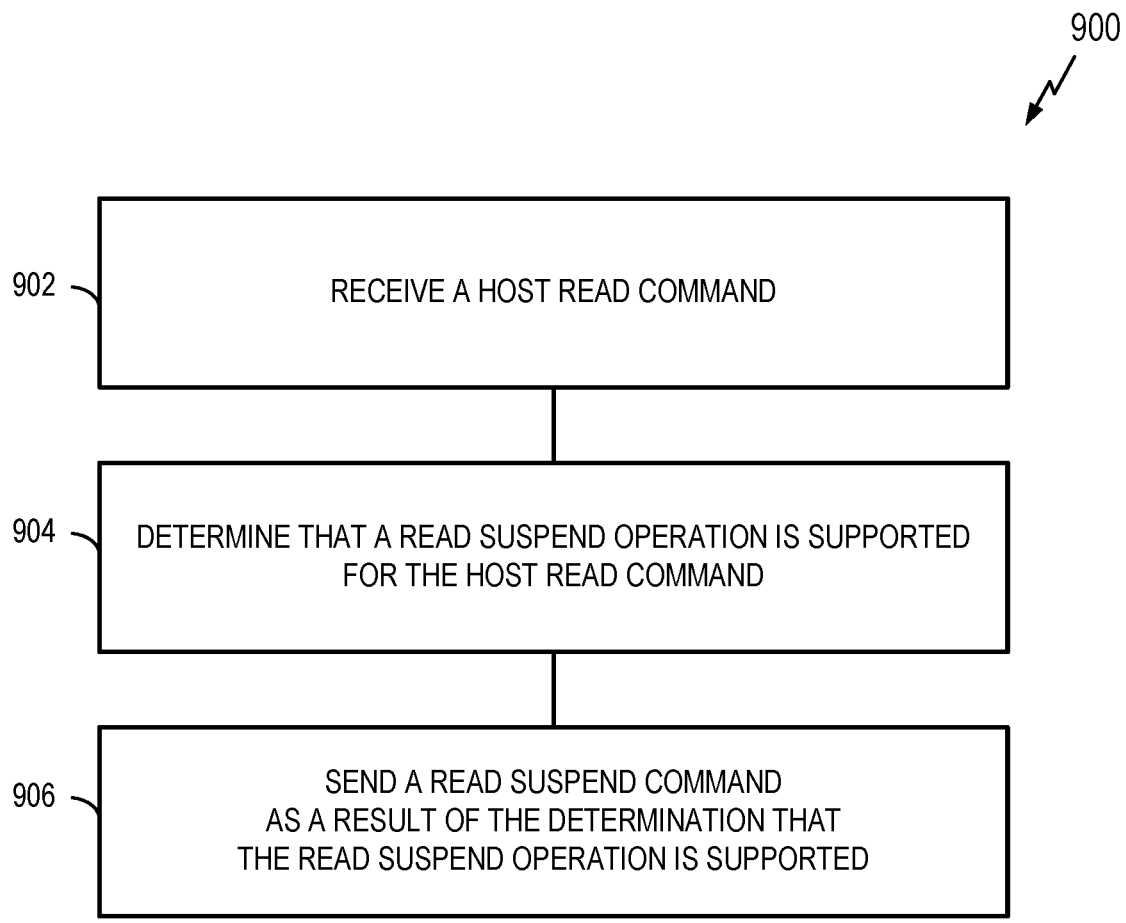
FIG. 9 illustrates an example process for determining whether to issue a read suspend command in accordance with one or more aspects of the disclosure.

FIG. 9 illustrates a process 900 for communication in accordance with some aspects of the disclosure. One or more aspects of the process 900 may be used in conjunction with (e.g., in addition to or as part of) the process 700 of FIG. 7. The process 900 may take place within a processing circuit (e.g., the processing circuit 610 of FIG. 6), which may be located in a controller, an SSD storage device, an SSD drive, a host device, or some other suitable apparatus. Of course, in various aspects within the scope of the disclosure, the process 900 may be implemented by any suitable apparatus capable of supporting memory-related operations.

At block 902, an apparatus (e.g., a controller) receives a host read command (e.g., for a high priority read). In some embodiments, the operations of block 902 may correspond to the operations of block 704 of FIG. 7.

At block 904, the apparatus determines that a read suspend operation is supported for the host read command In some implementations, the determination that the read suspend operation is supported for the host read command may include: determining a type of the host read command, and determining that the read suspend operation is allowed for the determined type.

At block 906, the apparatus sends a read suspend command as a result of the determination that the read suspend operation is supported. For example, the sending of the read suspend command at block 708 of FIG. 7 may be conditionally triggered based on whether suspension of a pending read operation is supported for the host read command received at block 902.

In some aspects, a process in accordance with the teachings herein may include any combination of the above operations.

Fourth Example Process

Figure 10:
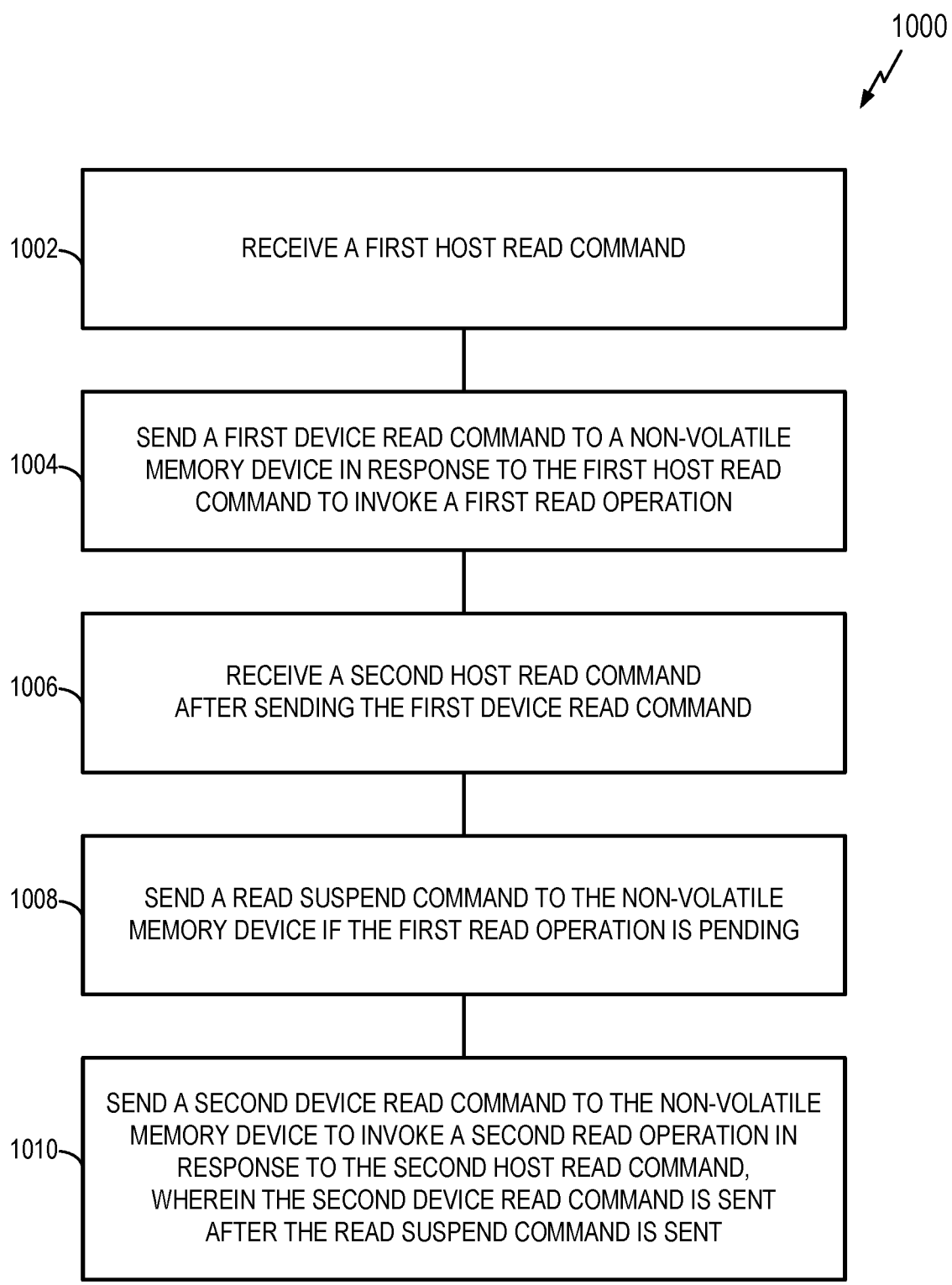
FIG. 10 illustrates an example process for handling prioritized reads in accordance with one or more aspects of the disclosure.

FIG. 10 illustrates a process 1000 for communication in accordance with some aspects of the disclosure. One or more aspects of the process 1000 may be used in conjunction with (e.g., in addition to or as part of) the process 700 of FIG. 7. The process 1000 may take place within a processing circuit (e.g., the processing circuit 610 of FIG. 6), which may be located in a controller, an SSD storage device, an SSD drive, a host device, or some other suitable apparatus. Of course, in various aspects within the scope of the disclosure, the process 1000 may be implemented by any suitable apparatus capable of supporting memory-related operations.

At block 1002, an apparatus (e.g., a controller) the apparatus receives a first host read command. For example, the apparatus may receive a read request from a host device that request a low priority read from a particular page of the non-volatile memory device. With respect to the host read command of block 704 of FIG. 7 or block 1006 below, the host read command of block 1002 may be deemed "another" host read command.

At block 1004, the apparatus sends a first device read command to the non-volatile memory device in response to the host read command (e.g., the "other" host read command) received at block 1002 (e.g., to invoke a first read operation). In some embodiments, the operations of block 1004 may correspond to the operations of block 702 of FIG. 7.

At block 1006, the apparatus receives a second host read command after sending the first device read command at block 1004. For example, the apparatus may receive a read request from a host device that request a high priority read from another page of the non-volatile volatile memory device. In some embodiments, the operations of block 1006 may correspond to the operations of block 704 of FIG. 7.

At block 1008, the apparatus sends a read suspend command to the non-volatile memory device if the first read operation is pending. In some embodiments, the operations of block 1008 may correspond to the operations of block 708 of FIG. 7.

At block 1010, the apparatus sends a second device read command to the non-volatile memory device to invoke a second read operation in response to the second host read command Here, the second device read command is sent after the read suspend command is sent at block 1008. In some embodiments, the operations of block 1010 may correspond to the operations of block 710 of FIG. 7.

In some aspects, a process in accordance with the teachings herein may include any combination of the above operations.

Fifth Example Process

Figure 11:
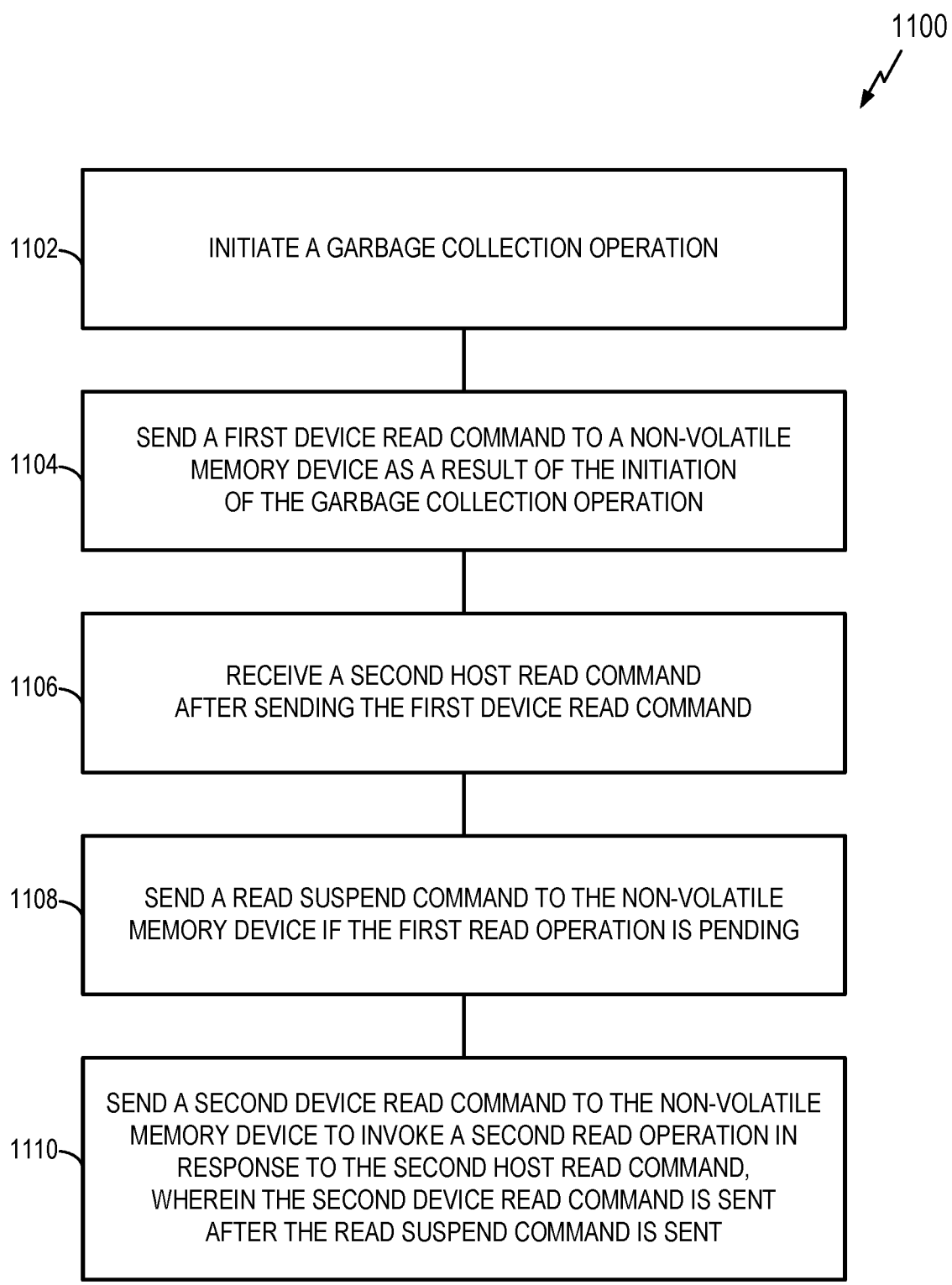
FIG. 11 illustrates an example process for handling prioritized operations in accordance with one or more aspects of the disclosure.

FIG. 11 illustrates a process 1100 for communication in accordance with some aspects of the disclosure. One or more aspects of the process 1100 may be used in conjunction with (e.g., in addition to or as part of) the process 700 of FIG. 7. The process 1100 may take place within a processing circuit (e.g., the processing circuit 610 of FIG. 6), which may be located in a controller, an SSD storage device, an SSD drive, a host device, or some other suitable apparatus. Of course, in various aspects within the scope of the disclosure, the process 1100 may be implemented by any suitable apparatus capable of supporting memory-related operations.

At block 1102, an apparatus (e.g., a controller) initiates a garbage collection operation.

At block 1104, the apparatus sends a first read command as a result of the initiation of the garbage collection operation. In some embodiments, the operations of block 1104 may correspond to the operations of block 702 of FIG. 7.

At block 1106, the apparatus receives a second host read command after sending the first device read command at block 1004. For example, the apparatus may receive a read request from a host device that request a high priority read from another page of the non-volatile memory device. In some embodiments, the operations of block 1106 may correspond to the operations of block 704 of FIG. 7.

At block 1108, the apparatus the apparatus sends a read suspend command to the non-volatile memory device if the first read operation is pending. In some embodiments, the operations of block 1108 may correspond to the operations of block 708 of FIG. 7.

At block 1110, the apparatus sends a second device read command to the non-volatile memory device to invoke a second read operation in response to the second host read command Here, the second device read command is sent after the read suspend command is sent at block 1108. In some embodiments, the operations of block 1110 may correspond to the operations of block 710 of FIG. 7.

In some aspects, a process in accordance with the teachings herein may include any combination of the above operations.

Second Example Apparatus

Figure 12:
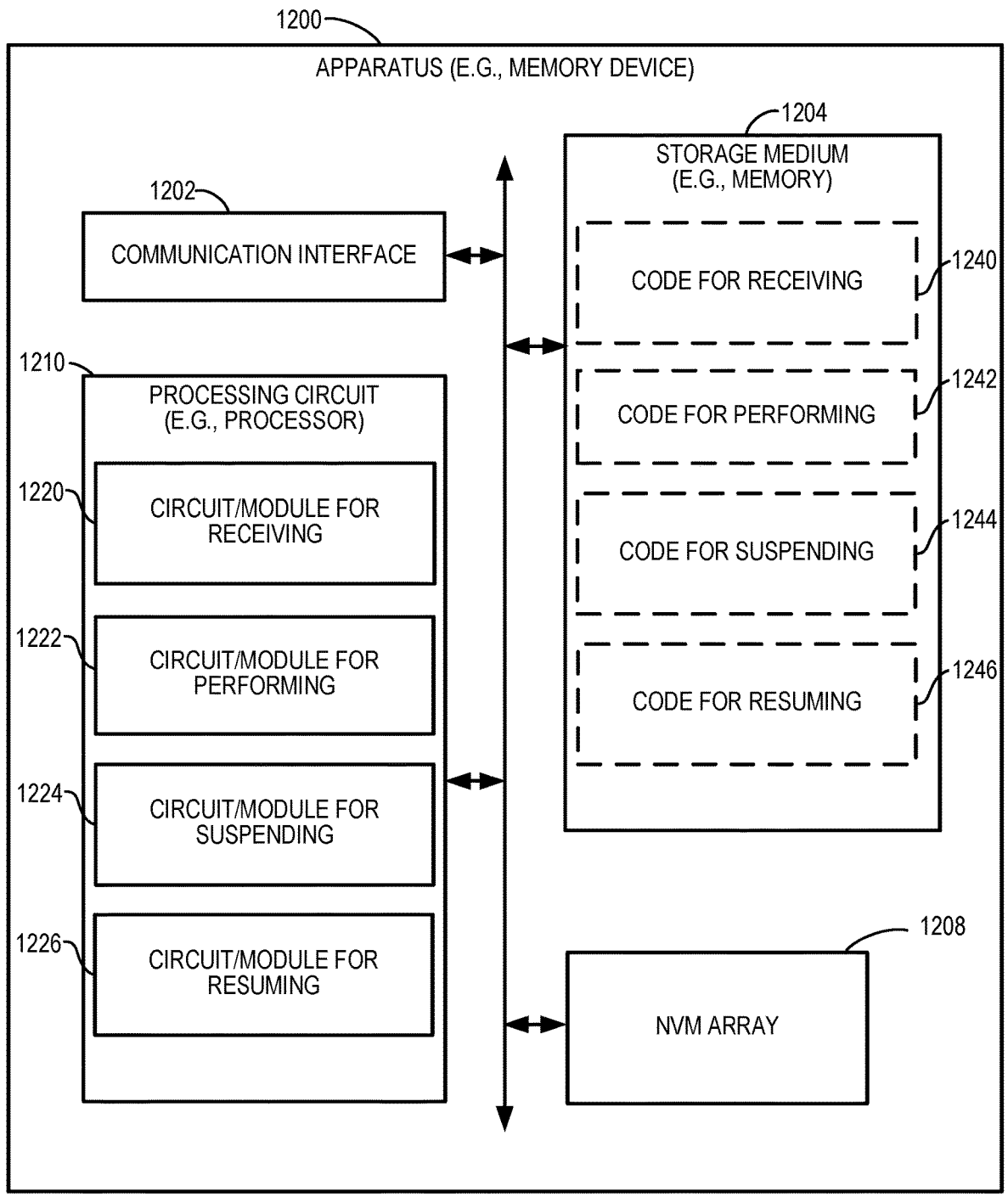
FIG. 12 illustrates an example hardware implementation for an apparatus (e.g., an electronic device) for storing data in accordance with one or more aspects of the disclosure.

FIG. 12 illustrates an embodiment of an apparatus 1200 configured to communicate according to one or more aspects of the disclosure. The apparatus 1200 could embody or be implemented within an NVM device, a NAND die, an SSD storage device, an SSD drive, or some other type of device that stores data. In various implementations, the apparatus 1200 could embody or be implemented within a computing device, a personal computer, a portable device, or workstation, a server, a personal digital assistant, a digital camera, a digital phone, an entertainment device, a medical device, or any other electronic device that stores data.

The apparatus 1200 includes a communication interface 1202, a storage medium 1204, an NVM array 1208, and a processing circuit 1210 (e.g., at least one processor and/or other suitable circuitry). In general, the components of FIG. 12 may be similar to corresponding components of the apparatus 600 of FIG. 6.

According to one or more aspects of the disclosure, the processing circuit 1210 may be adapted to perform any or all of the features, processes, functions, operations and/or routines for any or all of the apparatuses described herein. For example, the processing circuit 1210 may be configured to perform any of the steps, functions, and/or processes described with respect to FIGS. 1-5, 13, and 14. As used herein, the term "adapted" in relation to the processing circuit 1210 may refer to the processing circuit 1210 being one or more of configured, used, implemented, and/or programmed to perform a particular process, function, operation and/or routine according to various features described herein.

The processing circuit 1210 may be a specialized processor, such as an application-specific integrated circuit (ASIC) that serves as a means for (e.g., structure for) carrying out any one of the operations described in conjunction with FIGS. 1-5, 13, and 14. The processing circuit 1210 serves as one example of a means for sending and/or a means for receiving. In various implementations, the processing circuit 1210 may provide and/or incorporate, at least in part, the functionality described above for the NVM 112 of FIG. 1 or the memory device 506 of FIG. 5.

According to at least one example of the apparatus 1200, the processing circuit 1210 may include one or more of a circuit/module for receiving 1220, a circuit/module for performing 1222, a circuit/module for suspending 1224, or a circuit/module for resuming 1226. In various implementations, the circuit/module for receiving 1220, the circuit/module for performing 1222, the circuit/module for suspending 1224, or the circuit/module for resuming 1226 may provide and/or incorporate, at least in part, the functionality described above for the NVM 112 of FIG. 1 or the memory device 506 of FIG. 5.

As mentioned above, programming stored by the storage medium 1204, when executed by the processing circuit 1210, causes the processing circuit 1210 to perform one or more of the various functions and/or process operations described herein. For example, the programming may cause the processing circuit 1210 to perform the various functions, steps, and/or processes described herein with respect to FIGS. 1-5, 13, and 14 in various implementations. As shown in FIG. 12, the storage medium 1204 may include one or more of code for receiving 1240, code for performing 1242, code for suspending 1244, or code for resuming 1246. In various implementations, the code for receiving 1240, the code for performing 1242, the code for suspending 1244, or the code for resuming 1246 may be executed or otherwise used to provide the functionality described herein for the circuit/module for receiving 1220, the circuit/module for performing 1222, the circuit/module for suspending 1224, or the circuit/module for resuming 1226.

Sixth Example Process

Figure 13:
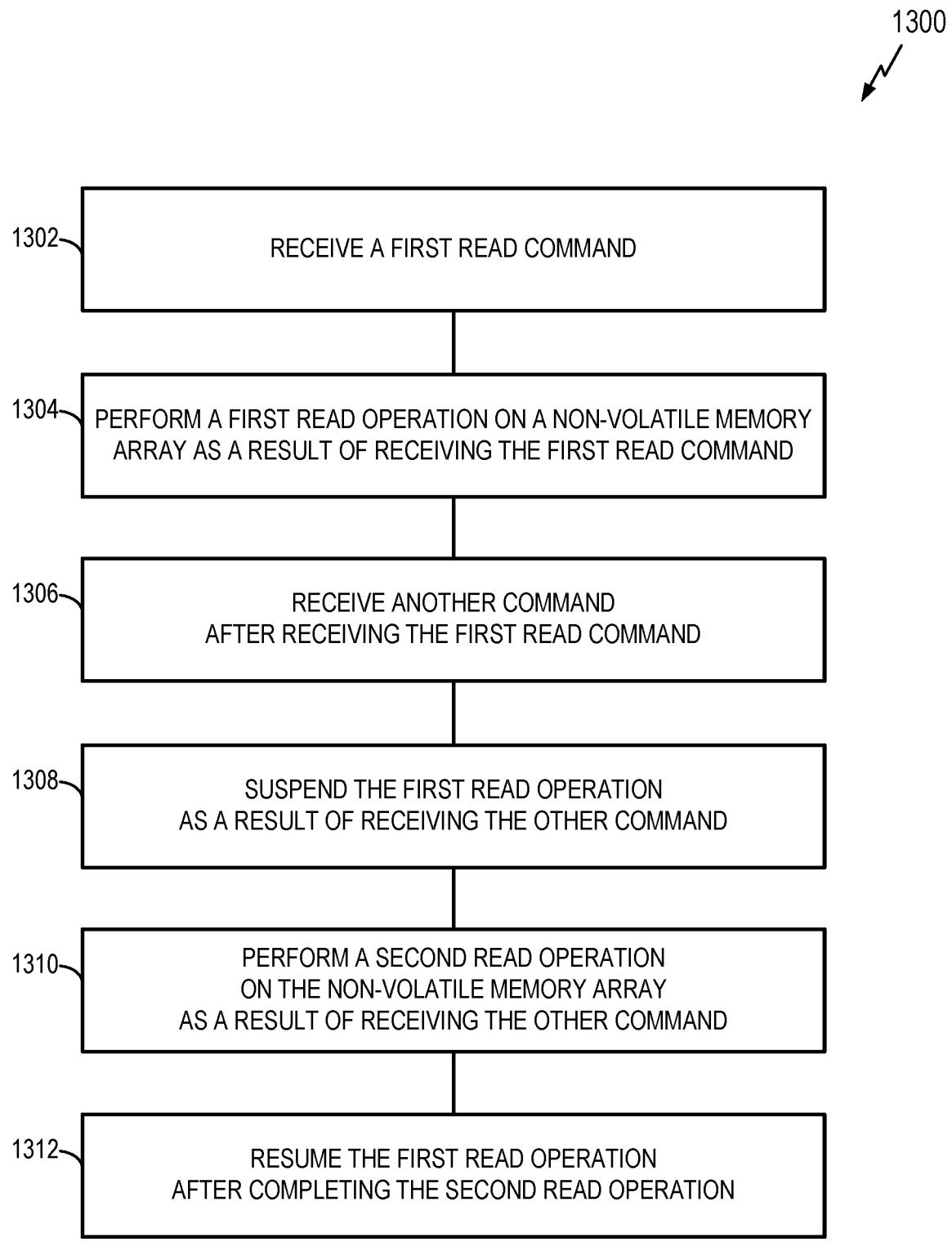
FIG. 13 illustrates an example process for performing read operations in accordance with one or more aspects of the disclosure.

FIG. 13 illustrates a process 1300 for communication in accordance with some aspects of the disclosure. The process 1300 may take place within a processing circuit (e.g., the processing circuit 1210 of FIG. 12), which may be located in a controller, an SSD storage device, an SSD drive, a host device, or some other suitable apparatus. Of course, in various aspects within the scope of the disclosure, the process 1300 may be implemented by any suitable apparatus capable of supporting memory-related operations.

At block 1302, an apparatus (e.g., a memory device of a solid state drive device) receives a first read command (e.g., from a controller of the solid state drive device). For example, the apparatus may receive the first device read command sent at block 702 of FIG. 7 (e.g., for a low priority read).

At block 1304, the apparatus performs a first read operation on a non-volatile memory array as a result of receiving the first read command.

At block 1306, the apparatus receives another command after receiving the first read command at block 1302. For example, in some embodiments (e.g., a manual suspend scheme), the apparatus may receive the read suspend command sent at block 708 of FIG. 7. As another example (e.g., an automatic suspend scheme), the apparatus may receive a second read command. For example, the apparatus may receive a high priority device read command from a controller.

At block 1308, the apparatus suspends the first read operation as a result of receiving the other command at block 1306. For example, for an automatic suspend scheme, the apparatus may suspend the first read operation as a result of receiving a second read command before the first read operation is completed. Alternatively, for a manual suspend scheme, the apparatus may suspend the first read operation as a result of receiving a read suspend command.

In some embodiments, the suspending of the first read operation may include temporarily stopping data sensing for the first read operation after completing data sensing for a memory level that was being sensed when the read suspend command was received. In some embodiments, the suspending of the first read operation may include generating a signal (e.g., RBx) that indicates that the first read operation has been suspended and outputting the signal.

At block 1310, the apparatus performs a second read operation on the non-volatile memory array as a result of receiving the other command at block 1306. For example, for an automatic suspend scheme, the apparatus may perform a high priority read operation at block 1310 as a result of receiving a high priority device read command at block 1306. As another example, for a manual suspend scheme, the apparatus may perform a high priority read operation at block 1310 as a result of receiving a high priority device read command from a controller in conjunction with (e.g., subsequent to) receipt of a read suspend command from the controller at block 1306.

At block 1312, the apparatus resumes the first read operation after completing the second read operation. In embodiments where the other command is a read suspend command, the apparatus may resume the first read operation as a result of receiving a read resume command after completing the second read operation.

In some embodiments, the resuming of the first read operation may include commencing data sensing for another memory level (e.g., a memory level other than the memory level that was being sensed when the read suspend command was received). In some embodiments, the resuming of the first read operation may include preparing for readout any data for which data sensing was completed prior to suspension of the first read operation. In some embodiments, the resuming of the first read operation may include electing to not use sensed data stored in a first data register for the second read operation.

In some embodiments, the suspending of the first read operation may include moving data read from the non-volatile memory array prior to the receipt of the read suspend command from a first data register into a second data register. In this case, the resuming of the first read operation may include moving the data that was moved into the second data register to the first data register. In some embodiments, the first data register may include (e.g., may be) a first data latch (e.g., an external data latch and/or an internal data latch) and the second data register may include (e.g., may be) a second data latch (e.g., an internal data latch).

The read operations may take different forms in different embodiments. In some embodiments, the first read operation is associated with a first priority, the second read operation is associated with a second priority, and the second priority is higher than the first priority. In some embodiments, the first read operation may include (e.g., may be) a garbage read operation, and the second read operation may include (e.g., may be) a high priority read operation (e.g., a full sequence read operation, a single page read operation, a cached read operation, a program suspend read operation, or some other type of read operation associated with a higher priority than the first read operation).

In some aspects, a process in accordance with the teachings herein may include any combination of the above operations.

Seventh Example Process

Figure 14:
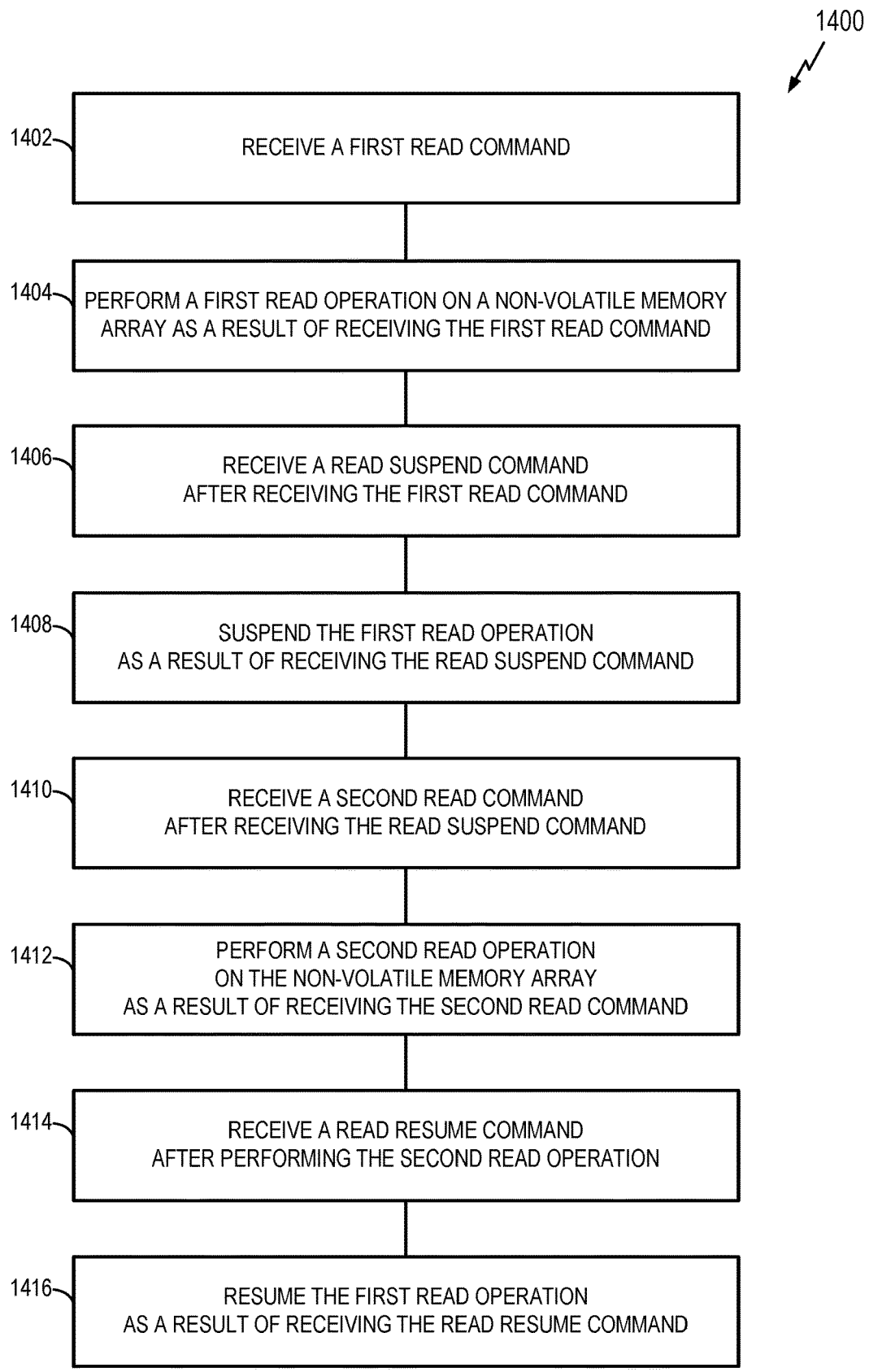
FIG. 14 illustrates another example process for performing read operations in accordance with one or more aspects of the disclosure.

FIG. 14 illustrates a process 1400 for communication in accordance with some aspects of the disclosure. One or more aspects of the process 1400 may be used in conjunction with (e.g., in addition to or as part of) the process 1300 of FIG. 13. The process 1400 may take place within a processing circuit (e.g., the processing circuit 1210 of FIG. 12), which may be located in a controller, an SSD storage device, an SSD drive, a host device, or some other suitable apparatus. Of course, in various aspects within the scope of the disclosure, the process 1400 may be implemented by any suitable apparatus capable of supporting memory-related operations.

At block 1402, an apparatus (e.g., a memory device of a solid state drive device) receives a first read command (e.g., from a controller of the solid state drive device). For example, the apparatus may receive the first device read command sent at block 702 of FIG. 7.

At block 1404, the apparatus performs a first read operation on a non-volatile memory array as a result of receiving the first read command.

At block 1406, the apparatus receives a read suspend command after receiving the first read command at block 1402. For example, the apparatus may receive the read suspend command sent at block 708 of FIG. 7.

At block 1408, the apparatus suspends the first read operation as a result of receiving the read suspend command at block 1406. In some embodiments, the suspending of the first read operation may include temporarily stopping data sensing for the first read operation after completing data sensing for a memory level that was being sensed when the read suspend command was received. In some embodiments, the suspending of the first read operation may include generating a signal (e.g., RBx) that indicates that the first read operation has been suspended and outputting the signal.

At block 1410, the apparatus receives a second read command after receiving the read suspend command at block 1406. For example, the apparatus may receive the second device read command sent at block 710 of FIG. 7.

At block 1412, the apparatus performs a second read operation on the non-volatile memory array as a result of receiving the second read command at block 1410.

At block 1414, the apparatus receives a read resume command after completing the second read operation. For example, the apparatus may receive the read resume command sent at block 712 of FIG. 7 or block 810 of FIG. 8.

At block 1416, the apparatus resumes the first read operation as a result of receiving the read resume command at block 1414. In some embodiments, the resuming of the first read operation may include commencing data sensing for another memory level (e.g., a memory level other than the memory level that was being sensed when the read suspend command was received). In some embodiments, the resuming of the first read operation may include preparing for readout any data for which data sensing was completed prior to suspension of the first read operation. In some embodiments, the resuming of the first read operation may include electing to not use sensed data stored in a first data register for the second read operation.

In some embodiments, the suspending of the first read operation may include moving data read from the non-volatile memory array prior to the receipt of the read suspend command from a first data register into a second data register. In this case, the resuming of the first read operation may include moving the data that was moved into the second data register to the first data register. In some embodiments, the first data register may include (e.g., may be) a first data latch (e.g., an external data latch and/or an internal data latch) and the second data register may include (e.g., may be) a second data latch (e.g., an internal data latch).

The read operations may take different forms in different embodiments. In some embodiments, the first read operation is associated with a first priority, the second read operation is associated with a second priority, and the second priority is higher than the first priority. In some embodiments, the first read operation may include (e.g., may be) a garbage read operation, and the second read operation may include (e.g., may be) a high priority read operation (e.g., a full sequence read operation, a single page read operation, a cached read operation, a program suspend read operation, or some other type of read operation associated with a higher priority than the first read operation).

In some aspects, a process in accordance with the teachings herein may include any combination of the above operations.

Additional Aspects

The examples set forth herein are provided to illustrate certain concepts of the disclosure. The apparatuses, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," an variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of a, b, or c" or "a, b, c, or any combination thereof" used in the description or the claims means "a or b or c or any combination of these elements."

For example, this terminology may include a, or b, or c, or a and b, or a and c, or a and b and c, or 2a, or 2b, or 2c, or 2a and b, and so on.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. A data storage apparatus, comprising:
a non-volatile memory (NVM) array; and
a processor coupled to the NVM array and configured to:
receive a first read command;
perform a first read operation on the NVM array as a result of receiving the first read command, wherein the first read operation comprises data sensing at a plurality of memory levels starting at a first memory level and ending at a last memory level;
receive a read suspend command after receiving the first read command;
suspend the first read operation as a result of receiving the read suspend command, wherein the suspension of the first read operation comprises temporarily stopping data sensing for the first read operation after completing data sensing for the first memory level of the plurality of memory levels that was being sensed when the read suspend command was received, wherein the suspension of the first read operation further comprises storing first data obtained by the data sensing for the first memory level in a first data register of the data storage apparatus and then moving the first data from the first data register into a second data register;
receive a second read command after receiving the read suspend command and after moving the first data into the second data register;
perform a second read operation on the NVM array as a result of receiving the second read command; and
resume the first read operation after completing the second read operation, wherein the resumption of the first read operation comprises moving the first data that was moved into the second data register to the first data register and commencing data sensing for a second memory level of the plurality of memory levels.

2. The apparatus of claim 1, wherein the processor is further configured to:
receive a read resume command after performing the second read operation; and
resume the first read operation as a result of receiving the read resume command.

3. The apparatus of claim 1, wherein:
the first read operation is associated with a first priority;
the second read operation is associated with a second priority; and
the second priority is higher than the first priority.

4. The apparatus of claim 1, wherein the resumption of the first read operation comprises:
preparing for readout any data for which data sensing was completed prior to the suspension of the first read operation.

5. The apparatus of claim 1, wherein:
the first data register comprises an external data latch or an internal data latch; and
the second data register comprises an internal data latch.

6. The apparatus of claim 1, wherein the suspension of the first read operation comprises:
electing to not use sensed data stored in a first data register for the second read operation.

7. The apparatus of claim 1, wherein the suspension of the first read operation comprises:
generating a signal that indicates that the first read operation has been suspended; and
outputting the signal.

8. The apparatus of claim 1, wherein:
the first read operation comprises a garbage collection read operation; and
the second read operation comprises a high priority read operation associated with a higher priority than the first read operation.

9. A method of controlling a non-volatile memory (NVM), comprising:
sending a first NVM read command to the NVM to invoke a first read operation, wherein the NVM is configured to perform the first read operation on an NVM array in response to the first NVM read command;
receiving a first host read command from a host device after sending the first NVM read command;
determining that the first read operation is pending after receiving the first host read command;
sending a read suspend command to the NVM as a result of the receipt of the first host read command and the determination that the first read operation is pending, wherein the NVM is configured to suspend the first read operation in response to the read suspend command by temporarily stopping data sensing for the first read operation after completing data sensing for a memory level that was being sensed when the read suspend command was received by the NVM, wherein the suspension of the first read operation further comprises storing first data obtained by the data sensing in a first data register and then moving the first data from the first data register into a second data register;
sending a second NVM read command to the NVM to invoke a second read operation in response to the first host read command, wherein the second NVM read command is sent after the read suspend command is sent and after the first data is moved into the second data register, wherein the NVM is configured to perform the second read operation on the NVM array while the first read operation is suspended in response to the second NVM read command;
determining that the second read operation has completed;
sending a read resume command to the NVM as a result of the determining that the second read operation has completed, wherein the NVM is configured to resume the first read operation in response to the read resume command, wherein the resumption of the first read operation comprises moving the first data that was moved into the second data register to the first data register; and
receiving data for the first read operation from the NVM after sending the read resume command.

10. The method of claim 9, further comprising:
determining that the first read operation is suspended after sending the read suspend command,
wherein the second NVM read command is sent in response to the determination that the first read operation is suspended.

11. The method of claim 9, further comprising:
determining that a read suspend operation is supported for the first host read command,
wherein the read suspend command is sent as a result of the determination that the read suspend operation is supported.

12. The method of claim 9, further comprising:
receiving a second host read command from the host device,
wherein the first NVM read command is sent in response to the receiving of the second host read command.

13. The method of claim 9, further comprising:
initiating a garbage collection operation,
wherein the first NVM read command is sent as a result of the initiation of the garbage collection operation.

14. An apparatus for controlling a non-volatile memory (NVM), comprising:
means for sending a first NVM read command to the NVM to invoke a first read operation, wherein the NVM is configured to perform the first read operation on an NVM array in response to the first NVM read command;
means for receiving a first host read command from a host device after sending the first NVM read command;
means for determining that the first read operation is pending after receiving the first host read command;
wherein the means for sending is further for sending a read suspend command to the NVM as a result of the receipt of the first host read command and the determination that the first read operation is pending, wherein the NVM is configured to suspend the first read operation in response to the read suspend command by temporarily stopping data sensing for the first read operation after completing data sensing for a memory level that was being sensed when the read suspend command was received by the NVM, wherein the suspension of the first read operation further comprises storing first data obtained by the data sensing in a first data register and then moving the first data from the first data register into a second data register;
wherein the means for sending is further for sending a second NVM read command to the NVM to invoke a second read operation in response to the first host read command, wherein the second NVM read command is sent after the read suspend command is sent and after the first data is moved into the second data register, wherein the NVM is configured to perform the second read operation on the NVM array while the first read operation is suspended in response to the second NVM read command;
means for determining that the second read operation has completed;
wherein the means for sending is further for sending a read resume command to the NVM as a result of the determination that the second read operation has completed, wherein the NVM is configured to resume the first read operation in response to the read resume command, wherein the resumption of the first read operation comprises moving the first data that was moved into the second data register to the first data register; and
means for receiving data for the first read operation from the NVM after sending the read resume command.

15. An apparatus comprising:
a host interface;
a non-volatile memory (NVM);
an NVM interface; and
a processor coupled to the host interface and the NVM interface, and configured to:
send a first NVM read command to the NVM via the NVM interface to invoke a first read operation, wherein the NVM is configured to perform the first read operation on an NVM array in response to the first NVM read command,
receive a first host read command from a host device via the host interface after sending the first NVM read command,
determine that the first read operation is pending after receiving the first host read command,
send a read suspend command to the NVM via the NVM interface as a result of the receipt of the first host read command and the determination that the first read operation is pending, wherein the NVM is configured to suspend the first read operation in response to the read suspend command by temporarily stopping data sensing for the first read operation after completing data sensing for a memory level that was being sensed when the read suspend command was received by the NVM, wherein the suspension of the first read operation further comprises storing first data obtained by the data sensing in a first data register and then moving the first data from the first data register into a second data register,
send a second NVM read command to the NVM via the NVM interface to invoke a second read operation in response to the first host read command, wherein the second NVM read command is sent after the read suspend command is sent and after the first data is moved into the second data register, wherein the NVM is configured to perform the second read operation on the NVM array while the first read operation is suspended in response to the second NVM read command,
determine that the second read operation has completed,
send a read resume command to the NVM via the NVM interface as a result of the determination that the second read operation has completed, wherein the NVM is configured to resume the first read operation in response to the read resume command, wherein the resumption of the first read operation comprises moving the first data that was moved into the second data register to the first data register, and
receive data for the first read operation from the NVM via the NVM interface after sending the read resume command.

16. The apparatus of claim 15, wherein:
the first read operation is associated with a first priority;
the second read operation is associated with a second priority; and
the second priority is higher than the first priority.

17. The apparatus of claim 15, wherein the processor is further configured to:
determine that the first read operation is suspended after sending the read suspend command; and
send the second NVM read command in response to the determination that the first read operation is suspended.

18. The apparatus of claim 15, wherein the processor is further configured to:
determine that a read suspend operation is supported for the first host read command, wherein the read suspend operation comprises suspending a read for a second host command that has a lower priority than the first host read command; and send the read suspend command as a result of the determination that the read suspend operation is supported.

19. The apparatus of claim 18, wherein the determination that the read suspend operation is supported for the first host read command comprises:
   determining a type of the host read command; and
   determining that the read suspend operation is allowed for the determined type.

20. The apparatus of claim 15, wherein:
   the first read operation comprises a garbage collection read operation; and
   the second read operation comprises a high priority read operation associated with a higher priority than the first read operation.

21. The apparatus of claim 15, wherein the processor is further configured to:
   receive a second host read command from the host device via the host interface; and
   send the first NVM read command to the NVM via the NVM interface in response to the receipt of the second host read command.

22. The apparatus of claim 15, wherein the processor is further configured to:
   initiate a garbage collection operation; and
   send the first NVM read command to the NVM via the NVM interface as a result of the initiation of the garbage collection operation.

23. The apparatus of claim 15, wherein the apparatus is a controller of a solid state device.

24. The apparatus of claim 15, wherein the resumption of the first read operation comprises:
   commencing data sensing for another memory level.

25. The apparatus of claim 15, wherein the processor is further configured to:
   identify a read command type of the host read command; and
   determine whether suspension of other commands is supported by the NVM for the read command type;
   wherein the read suspend command is sent to the NVM via the NVM interface as a result of the determination of whether suspension of other commands is supported by the NVM for the read command type.

* * * * *